(12) United States Patent
Chen et al.

(10) Patent No.: US 10,923,421 B2
(45) Date of Patent: Feb. 16, 2021

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Ying-Ju Chen, Yunlin County (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 59 days.

(21) Appl. No.: 16/391,309

(22) Filed: Apr. 23, 2019

(65) Prior Publication Data

US 2020/0343183 A1    Oct. 29, 2020

(51) Int. Cl.
*H01L 23/528* (2006.01)
*H01L 23/00* (2006.01)
(Continued)

(52) U.S. Cl.
CPC ........ *H01L 23/5283* (2013.01); *H01L 21/563* (2013.01); *H01L 21/76873* (2013.01); *H01L 23/3121* (2013.01); *H01L 23/3171* (2013.01); *H01L 23/5226* (2013.01); *H01L 24/09* (2013.01); *H01L 24/17* (2013.01); *H01L 24/33* (2013.01); *H01L 24/49* (2013.01); *H01L 24/73* (2013.01); *H01L 25/0657* (2013.01);
(Continued)

(58) Field of Classification Search
CPC ................ H01L 23/5283; H01L 24/73; H01L 21/76873; H01L 25/0657; H01L 24/17; H01L 24/09; H01L 24/49; H01L 23/3171; H01L 23/5226; H01L 24/33; H01L 23/3121; H01L 21/563
See application file for complete search history.

(56) References Cited

U.S. PATENT DOCUMENTS 8,993,380 B2    3/2015   Hou et al.
9,000,584 B2    4/2015   Lin et al.
(Continued)

FOREIGN PATENT DOCUMENTS

TW    201131719    9/2011
TW    201701443    1/2017
(Continued)

OTHER PUBLICATIONS

"Office Action of Taiwan Counterpart Application," dated Jan. 9, 2020, p. 1-p. 11.

*Primary Examiner* — Karen Kusumakar
*Assistant Examiner* — Adam S Bowen
(74) *Attorney, Agent, or Firm* — JCIPRNET

(57) ABSTRACT

A package structure includes a semiconductor die, a redistribution circuit structure, and a connection pad. The redistribution circuit structure is located on and electrically connected to the semiconductor die. The connection pad is embedded in and electrically connected to the redistribution circuit structure, and the connection pad includes a barrier film and a conductive pattern underlying thereto, where a surface of the barrier film is substantially leveled with an outer surface of the redistribution circuit structure.

20 Claims, 27 Drawing Sheets

(51) Int. Cl.
  *H01L 23/31* (2006.01)
  *H01L 23/522* (2006.01)
  *H01L 21/56* (2006.01)
  *H01L 21/768* (2006.01)
  *H01L 25/065* (2006.01)

(52) U.S. Cl.
  CPC ............ *H01L 2224/0231* (2013.01); *H01L 2224/02373* (2013.01); *H01L 2224/02379* (2013.01); *H01L 2224/02381* (2013.01); *H01L 2224/0401* (2013.01); *H01L 2224/73203* (2013.01); *H01L 2224/73257* (2013.01); *H01L 2224/73265* (2013.01); *H01L 2924/1436* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,691,708 B1* | 6/2017 | Huang ............ H01L 23/5389 |
| 9,735,131 B2 | 8/2017 | Su et al. |
| 9,812,426 B1* | 11/2017 | Wang ............ H01L 24/13 |
| 2017/0154850 A1* | 6/2017 | Kao ............ H01L 21/76832 |
| 2018/0047674 A1* | 2/2018 | Tsai ............ H01L 23/5384 |
| 2018/0096939 A1* | 4/2018 | Chiu ............ H01L 23/5386 |
| 2020/0075540 A1* | 3/2020 | Lu ............ H01L 23/3128 |

FOREIGN PATENT DOCUMENTS

| | | |
|---|---|---|
| TW | 201824483 | 7/2018 |
| TW | 201826403 | 7/2018 |

* cited by examiner

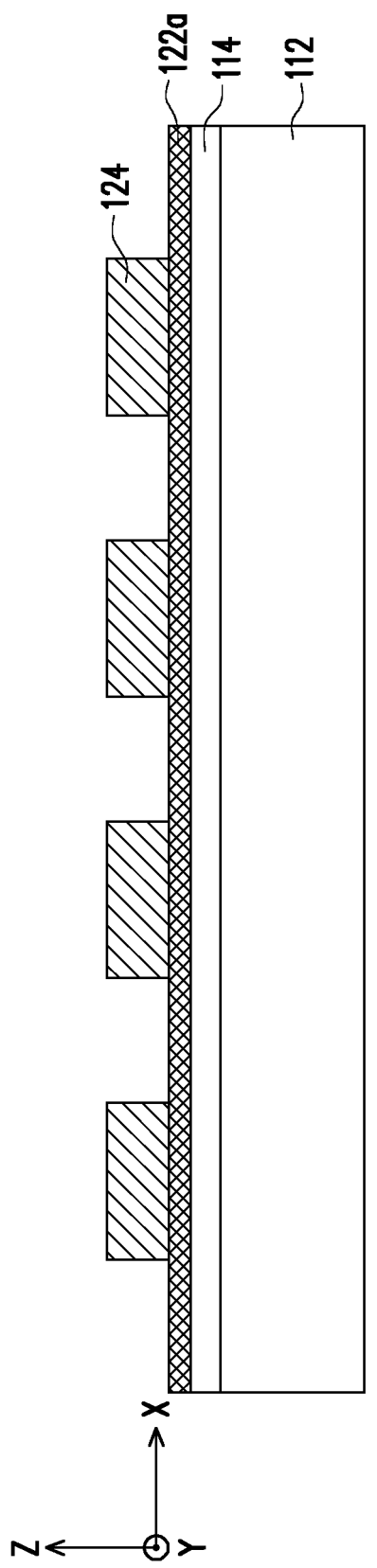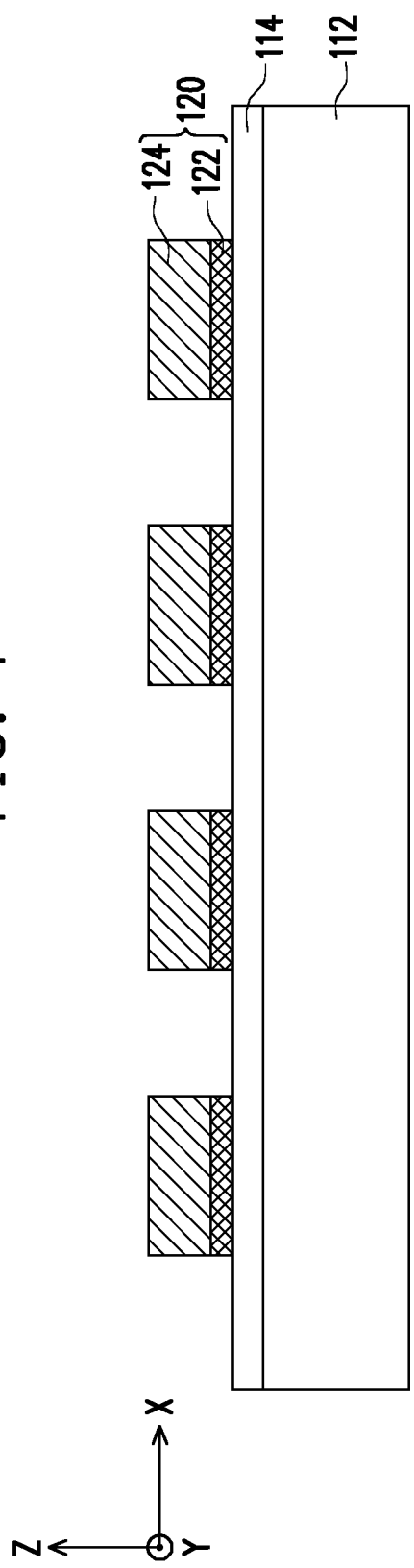

PACKAGE STRUCTURE AND METHOD OF MANUFACTURING THE SAME

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. In addition, such packages may further be integrated to a semiconductor substrate or carrier after dicing. Therefore, the reliability of the electrical connection between conductive terminals and an internal component (e.g. a redistribution circuit structure) within each package becomes important.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 14 are schematic cross sectional views of various stages in a manufacturing method of a package structure in accordance with some embodiments of the present disclosure.

DETAILED DESCRIPTION

Figure 3:
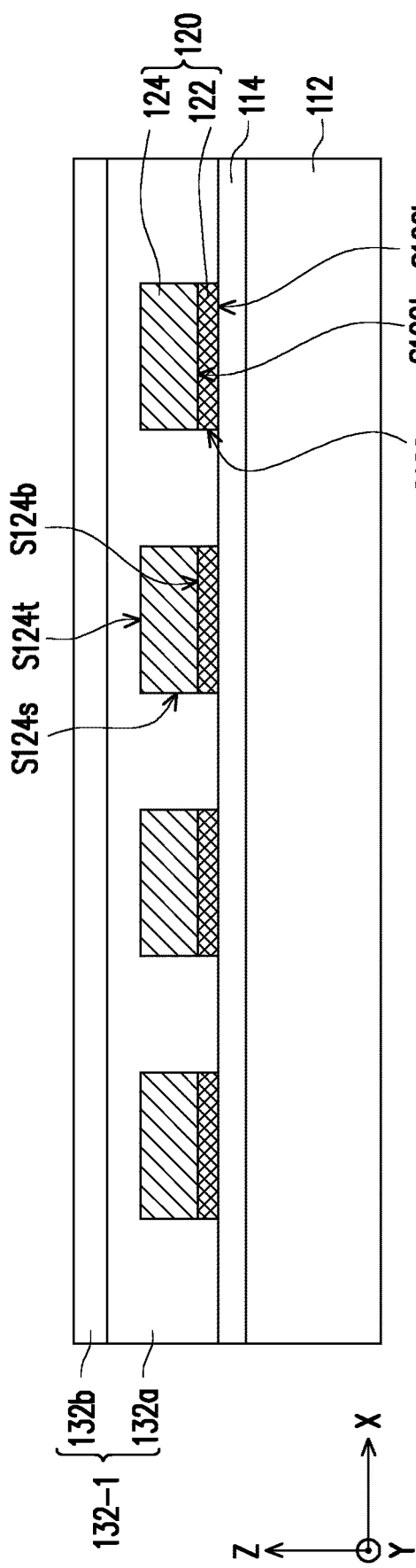

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 14 are schematic cross sectional views of various stages in a manufacturing method of a package structure in accordance with some embodiments of the present disclosure. FIG. 15 is an enlarged, schematic cross sectional view of a portion of the package structure depicted in FIG. 14, where the portion of the package structure is indicated by a dotted box E1 shown in FIG. 14. In embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 14, more than one (semiconductor) chips or dies are shown to represent plural (semiconductor) chips or dies of the wafer, and one (semiconductor) package structure is shown to represent plural (semiconductor) package structures obtained following the (semiconductor) manufacturing method, however the disclosure is not limited thereto. In other embodiments, one or more than one (semiconductor) chips or dies are shown to represent plural (semiconductor) chips or dies of the wafer, and one or more than one (semiconductor) package structure are shown to represent plural (semiconductor) package structures obtained following the (semiconductor) manufacturing method, however the disclosure is not limited thereto.

Referring to FIG. 1, in some embodiments, a carrier 112 is provided. In some embodiments, the carrier 112 may be a glass carrier or any suitable carrier for carrying a semiconductor wafer or a reconstituted wafer for the manufacturing method of the semiconductor package. In some embodiments, the carrier 112 is coated with a debond layer 114 (as shown in FIG. 1). The material of the debond layer 114 may be any material suitable for bonding and debonding the carrier 112 from the above layer(s) or any wafer(s) disposed thereon.

In some embodiments, the debond layer 114 may include a dielectric material layer made of a dielectric material including any suitable polymer-based dielectric material (such as benzocyclobutene (BCB), polybenzoxazole (PBO)). In an alternative embodiment, the debond layer 114 may include a dielectric material layer made of an epoxy-based thermal-release material, which loses its adhesive property when heated, such as a light-to-heat-conversion (LTHC) release coating film. In a further alternative embodiment, the debond layer 114 may include a dielectric material layer made of an ultra-violet (UV) glue, which loses its adhesive property when exposed to UV lights. In certain embodiments, the debond layer 114 may be dispensed as a liquid and cured, or may be a laminate film laminated onto the carrier 112, or may be the like. The top surface of the debond layer 114, which is opposite to a bottom surface contacting the carrier 112, may be leveled and may have a high degree of coplanarity. In certain embodiments, the debond layer 114 is, for example, a LTHC layer with good chemical resistance, and such layer enables room temperature debonding from the carrier 112 by applying laser irradiation, however the disclosure is not limited thereto.

In an alternative embodiment, a buffer layer (not shown) may be coated on the debond layer 114, where the debond layer 114 is sandwiched between the buffer layer and the carrier 112, and the top surface of the buffer layer may further provide a high degree of coplanarity. In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand and the design layout; the disclosure is not limited thereto.

Continued on FIG. 1, in some embodiments, a seed layer material 122a is formed on the debond layer 114 and over the carrier 112. For example, the seed layer material 122a is conformally disposed on the debond layer 114 in a manner of a blanket layer made of metal or metal alloy materials, the disclosure is not limited thereto. In some embodiments, the seed layer material 122a may be a single layer or a composite layer comprising a plurality of sub-layers formed of different materials. In some embodiments, the seed layer material 122a may include titanium, copper, molybdenum, tungsten, titanium nitride, titanium tungsten, combinations thereof, or the like. For example, the seed layer material 122a may include a titanium layer and a copper layer over the titanium layer. In some embodiments, the seed layer material 122a is formed by chemical vapor deposition (CVD), physical vapor deposition (PVD), atomic layer deposition (ALD), high density plasma CVD (HDPCVD) or combinations thereof. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, a plurality of conductive pads 124 are formed on the seed layer material 122a and over the carrier 112, as shown in FIG. 1. In some embodiments, the conductive pads 124 may be patterned aluminum layers (e.g. aluminum pads) formed by electroplating or deposition. As shown in FIG. 1, for example, the conductive pads 124 are directly disposed on the seed layer material 122a along a stacking direction (e.g. a direction Z) and are distributed over a surface of the seed layer material 122a along a X-Y plane. For example, a direction X and a direction Y are perpendicular to the direction Z, and the direction X and the direction Y are different. The number of the conductive pads 124 is not limited thereto, and may be designated and selected based on the demand. For example, the numbers of the conductive pads 124 may be one or more than one. As shown in FIG. 1, the conductive pads 124 are separated away and spacing apart from each other.

Referring to FIG. 2, in some embodiments, a plurality of barrier seed patterns 122 are then respectively formed immediately underlying the conductive pads 124 by removing portions of the seed layer material 122a not covered by the conductive pads 124. In some embodiments, using the conductive pads 124 as a mask, the barrier seed patterns 122 are formed by removing the portions of the seed layer material 122a not covered by the conductive pads 124 through etching process. The etching process, for example, may include dry etching, wet etching, or a combination thereof. In other words, for example, the seed layer material 122a is etched to form the barrier seed patterns 122 with the use of the conductive pads 124 (serving as an etching mask). With such, in a vertical projection on the carrier 112 along the stacking direction (e.g. the direction Z), a projection area of one conductive pad 124 is substantially the same as a projection area of a respective one barrier seed pattern 122 immediately underlying thereto. That is, in the direction Z, the conductive pads 124 each are completely overlapped with the respective one barrier seed pattern 122. In some embodiments, a sidewall of each of the conductive pads 124 is aligned with a sidewall of a respective one of the barrier seed patterns 122. The number of the barrier seed patterns 122 is not limited herein and may be designated and selected based on the demand, where the number of the barrier seed patterns 122 may be adjusted by controlling the number of the conductive pads 124. As shown in FIG. 2, for example, the barrier seed patterns 122 each are electrically connected to a respective one of the conductive pads 124. In the disclosure, each of the barrier seed patterns 122 and a respective one conductive pad 124 physically connected thereto are together referred to as a connection pad 120.

Referring to FIG. 3 to FIG. 8, in some embodiments, a redistribution circuit structure 130 is formed on the connection pads 120 and over the carrier 112. In some embodiments, the redistribution circuit structure 130 includes one or more than one dielectric layers 132 (e.g. a dielectric layer 132-1, a dielectric layer 132-2, and a dielectric layer 132-3) and one or more than one patterned conductive layers 134 (e.g. a patterned conductive layer 134-1, a patterned conductive layer 134-2, and a patterned conductive layer 134-3) arranged in alternation. However, in the disclosure, the number of the dielectric layers 132 and the number of the patterned conductive layers 134 are not limited to FIG. 3 to FIG. 8. For example, the number of the dielectric layers 132 and the number of the patterned conductive layers 134 may be independently one or more than one based on the demand and the design layout.

As illustrated in FIG. 3, in some embodiments, the dielectric layer 132-1 is formed on the connection pads 120 and over the carrier 112. In some embodiments, the dielectric layer 132-1 covers and wraps the connection pads 120. As shown in FIG. 3, for each connection pad 120, the conductive pad 124 is surrounded by the dielectric layer 132-1 and the barrier seed pattern 122, and a surface S122*b* of the barrier seed pattern 122 contacted with the debond layer 114 is free of the dielectric layer 132-1 while a sidewall S122*s* of the barrier seed pattern 122 is wrapped by the dielectric layer 132-1, where a surface S124*b* of the conductive pad 124 is in physical contact with a surface S122*t* of the barrier seed pattern 122. In detail, a top surface (e.g. a surface S124*t* of the conductive pad 124) and a sidewall (e.g. a sidewall S124*s* of the conductive pad 124 and the sidewall S122*s* of the barrier seed pattern 122) of the connection pad 120 are in physical contact with the dielectric layer 132-1 while a bottom surface (e.g. the surface S122*b* of the barrier seed pattern 122) of the connection pad 120 is free of the dielectric layer 132-1. In other words, each connection pad 120 is embedded in the dielectric layer 132-1 with one surface (e.g. the surface S122*b*) exposed by the dielectric layer 132-1, where the surface S122*b* of the barrier seed pattern 122 is substantially leveled with and coplanar to a surface S132-1*b* of the dielectric layer 132-1, as shown in FIG. 3, in some embodiments.

In some embodiments, the dielectric layer 132-1 includes a dielectric material 132*a* and a dielectric material 132*b* stacked in order. In some embodiments, the dielectric materials 132*a* and 132*b* may include silicon oxide, silicon nitride, polymer or a combination thereof, and are formed by depositing a dielectric material through a suitable process such as spin coating, CVD or the like, and then performing a planarization process on the dielectric material. In some embodiments, the function and material of the dielectric materials 132*a* and 132*b* may be the same or different from each other, the disclosure is not limited thereto.

In an alternative embodiment, additional dielectric materials (not shown) may be present between the dielectric materials 132*a* and 132*b*, between the dielectric material 132*a* and the connection pads 120, or a combination thereof. For example, the material and formation of the additional dielectric materials may be substantially the same or similar to the dielectric materials 132*a* and 132*b*, and thus are not repeated herein. In some embodiments, the function and material of the dielectric materials 132*a*, 132*b* and the additional dielectric materials may be the same or different from each other, the disclosure is not limited thereto. For example, the additional dielectric materials may be silicon nitride and used for etching stop layers, while the dielectric materials 132*a* and 132*b* may be silicon oxide and used for bonding.

Figure 4:
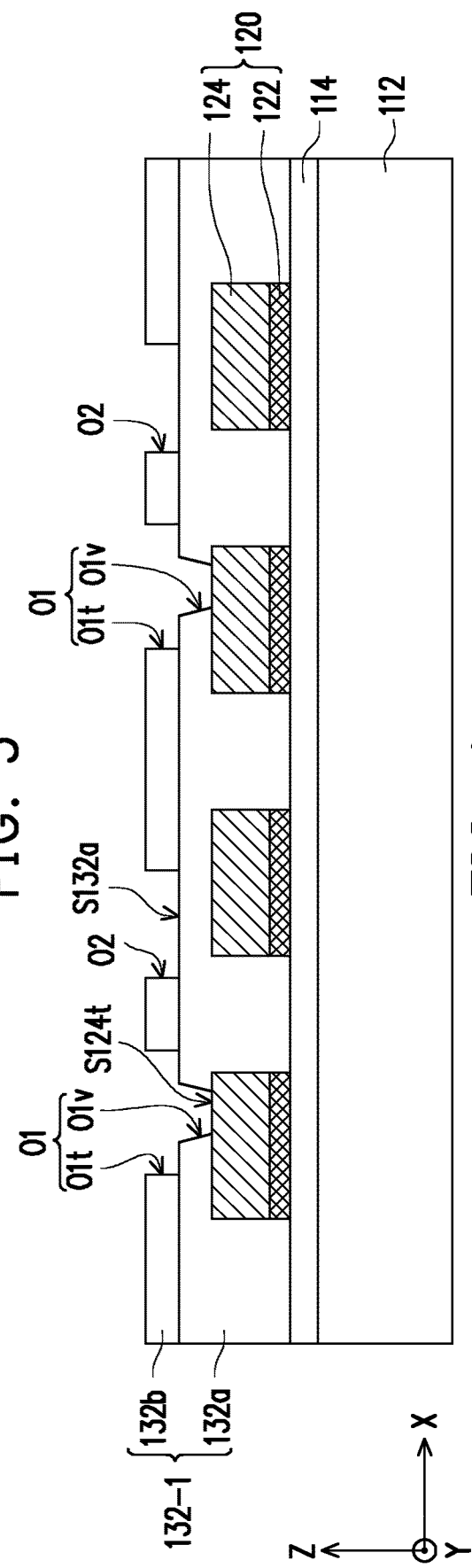

Referring to FIG. 3 and FIG. 4, a plurality of openings O1 and a plurality of openings O2 are formed in the dielectric layer 132-1. In some embodiments, the openings O1 penetrate the dielectric layer 132-1 to expose the connection pads 120 while the openings O2 is formed in the dielectric layer 132-1 without exposing the connection pads 120. The openings O1 each may be, but not limited to, a dual damascene opening. That is, the openings O1 each include a narrower via hole O1*v* and a wider trench hole O1*t* over the narrower via hole O1*v*. In some embodiments, the openings O1 are formed as following steps (referred as the trench first process). The dielectric material 132*b* is patterned by lithography and etching processes to form trench holes O1*t* therein. Positioning locations of the trench holes O1*t* are corresponding to positioning locations of the connection pads 120. Next, the dielectric material 132*a* is patterned by lithography and etching process to form via holes O1*v* therein. Positioning locations of the via holes O1*v* are corresponding to the positioning locations of the trench holes O1*t* and the positioning locations of the connection pads 120. As shown in FIG. 4, along the direction Z, the via holes O1*v* respectively spatially communicated to the trench holes O1*t* to form the openings O1. In some embodiments, the bottom width (or area) of the narrower via holes O1*v* is less than the width (or area) of the surfaces S124*t* of the conductive pads 124. In some alternative embodiments, the bottom width (or area) of the narrower via holes O1*v* is equal to the width (or area) of the surfaces S124*t* of the conductive pads 124. As shown in FIG. 4, for example, each opening O1 is corresponding to a respective one connection pad 120 and exposes at least a portion of the surface S124*t* of the conductive pad 124 of the respective one connection pad 120.

On the other hand, the openings O2 may be, but not limited to, a single damascene opening, in some embodiments. For example, the openings O2 each may be referred as a trench formed by patterning the dielectric material 132*b* to expose the dielectric material 132*a*. In some embodiments, positioning locations of the openings O2 are corresponding to the positioning locations of the connection pads 120, however the disclosure is not limited thereto. In other embodiments, the positioning locations of the openings O2 are not corresponding to the positioning locations of the connection pads 120. In further other embodiments, some of the positioning locations of the openings O2 are corresponding to the positioning locations of the connection pads 120, and some of the positioning locations of the openings O2 are not corresponding to the positioning locations of the connection pads 120. As shown in FIG. 4, for example, the openings O2 penetrate through the dielectric material 132*b* to expose a surface S132*a* of the dielectric material 132*a*.

In some embodiments, the formation of the openings O2 and the formation of the trench holes O1*t* of the openings O1 may be performed at the same step. In some embodiments, the formation of the openings O2 and the formation of the trench holes O1*t* of the openings O1 may be performed at the different steps. The numbers of the openings O1 and O2 are not limited herein, and may be designated and selected based on the demand and the design layout. For example, the numbers of the openings O1 and O2 may be one or more than one, however the disclosure is not limited thereto. In another example, the number of the openings O1 may be one or more than one, and the number of the openings O2 may be zero.

In the alternative embodiment of which the additional dielectric materials are present between the dielectric materials 132*a* and 132*b* and between the dielectric material 132*a* and the connection pads 120 (serving as an etching stop layer), the additional dielectric material between the dielectric material 132*a* and 132*b* may be also etched to form the trench holes O1*t* exposing the dielectric material 132*a* by an etching process, and the additional dielectric material between dielectric material 132*a* and the connection pads 120 may be also etched to form the via holes O1*v* exposing the connection pads 120 by an etching process. During the etching processes of the additional dielectric materials, an etching selectivity of the additional dielectric materials to the dielectric materials 132*a* and/or 132*b* is significantly high, so that the etching processes of the additional dielectric materials are performed without removal of the dielectric materials 132a and 132b (e.g. the removal of the dielectric materials 132a and 132b is significantly small and thus is negligible).

Figure 5:
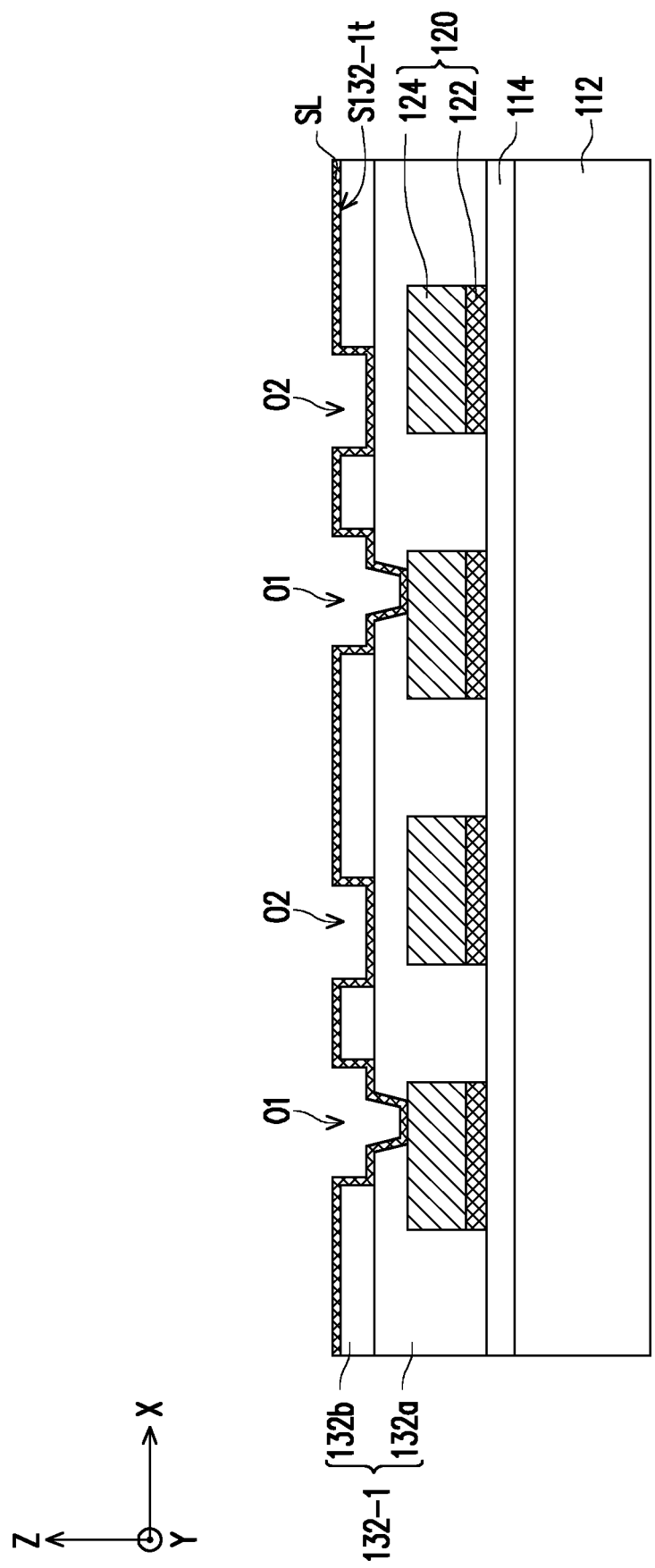

As illustrated in FIG. 5, in some embodiments, a seed layer material SL is formed on the dielectric layers 132-1 and over the carrier 112. In some embodiments, the seed layer material SL is directly formed on the dielectric layers 132-1 and further extends into the openings O1 and the openings O2 formed in the dielectric layer 132-1. In some embodiments, the seed layer material SL is formed conformal to the profiles of the dielectric layer 132-1 with the openings O1 and O2, evenly covering sidewalls and bottom surfaces of the openings O1 and O2 and a surface S132-1t of the dielectric layer 132-1. In other words, the sidewalls and bottom surfaces of the openings O1 and sidewalls and bottom surfaces of the openings O2 are completely covered by the seed layer material SL. As shown in FIG. 5, for example, portions of the seed layer material SL located within the openings O1 are in physical contact with the connection pads 120 exposed by the openings O1. The material and formation of the seed layer material SL are substantially the same or similar to the material and formation of the seed layer material 122a described in FIG. 1, and thus are not repeated herein for simplicity. In one embodiment, the material of the seed layer material SL is the same as the material of the seed layer material 122a, however the disclosure is not limited thereto. In an alternative embodiment, the material of the seed layer material SL may be different from the material of the seed layer material 122a. Moreover, the conformal seed layer material SL may assist lowering the resistance and improving electrical properties for the redistribution circuit structure 130.

Figure 6:
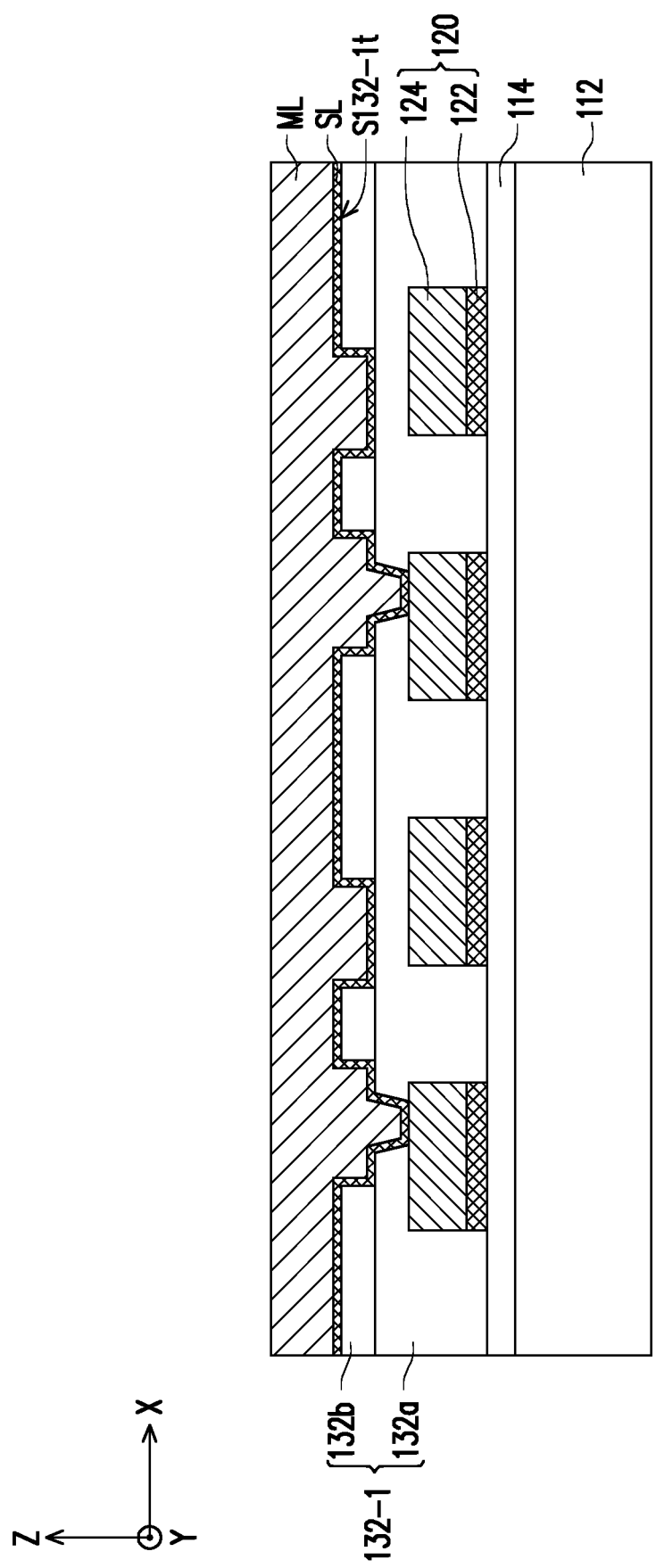

As illustrated in FIG. 6, in some embodiments, a metal material ML is formed on the seed layer material SL over the dielectric layer 132-1 to fill up the openings O1 and the openings O2 formed in the dielectric layer 132-1. In some embodiments, the metal material ML may be copper, nickel, aluminum, gold, silver, tungsten, an alloy thereof, or a combination thereof and formed by electro-chemical plating process, CVD, PVD or the like. However, it is appreciated that the scope of this disclosure is not limited to the materials and descriptions disclosed above.

Figure 7:
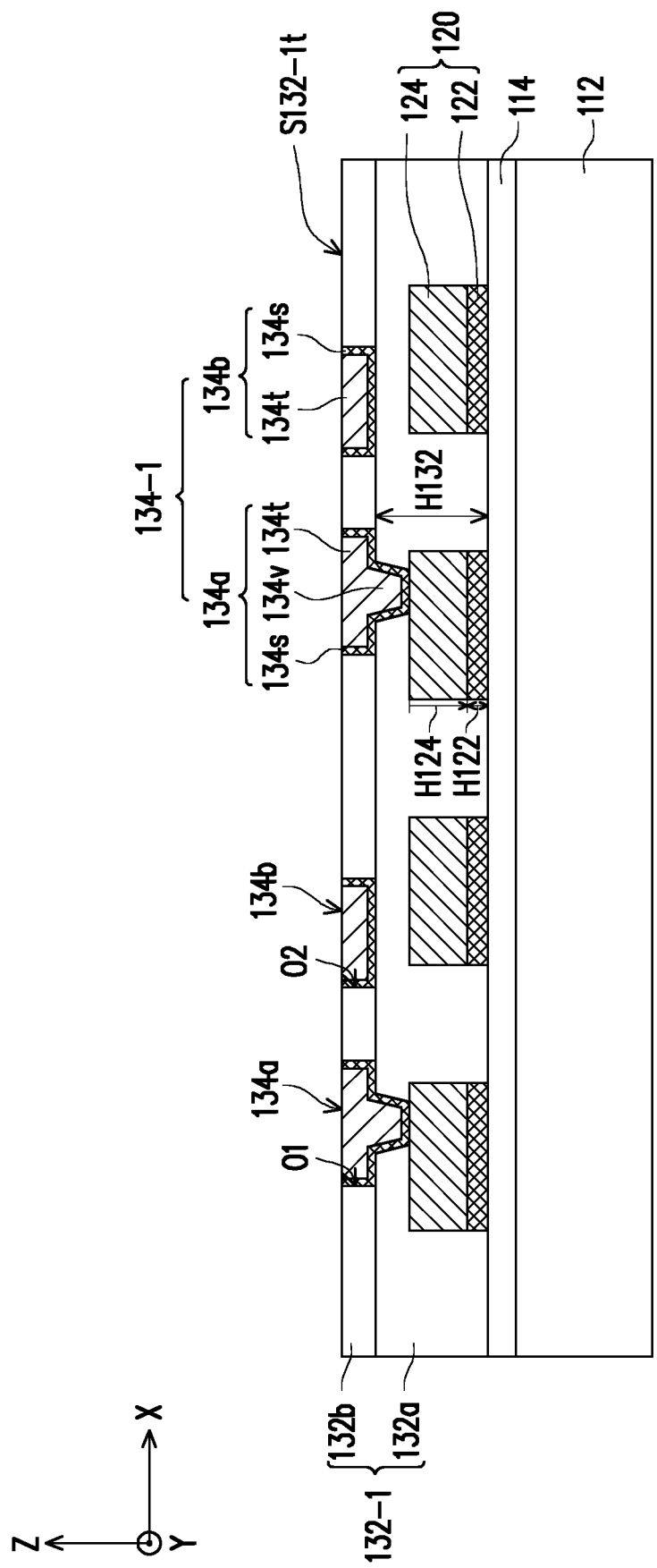

In some embodiments, referring to FIG. 6 and FIG. 7, a planarization process is performed to remove a portion of the metal material ML and a portion of the seed layer material SL above the surface S132-1t of the dielectric layer 132-1. In some embodiments, the metal material ML along with the seed layer material SL above the surface S132-1t of the dielectric layer 132-1 are removed until the surface S132-1t of the dielectric layer 132-1 is exposed. After the removal of the metal material ML and the seed layer material SL above the surface S132-1t of the dielectric layer 132-1, metallic patterns 134a each having a seed layer pattern 134s, a via 134v and a conductive trench 134t filled within the openings O1 and metallic patterns 134b each having the seed layer pattern 134s and the conductive trench 134t filled within the openings O2 are formed. In some embodiments, for each metallic pattern 134a, the seed layer pattern 134s, the via 134v and the conductive trench 134t are electrically coupled to each other. In some embodiments, for each metallic pattern 134b, the seed layer pattern 134s and the conductive trench 134t are electrically coupled to each other. In some embodiments, the planarization process includes a chemical-mechanical polishing (CMP) process, a mechanical grinding process, a fly cutting process or an etching back process, or a combination thereof.

In some embodiments of which the connection pads 120 embedded in the dielectric material 132a, a thickness H132 of the dielectric material 132a is ranging about 0.5 µm to about 10 µm. In some embodiments, a thickness H124 of the conductive pads 124 is ranging from about 5 kÅ to about 40 kÅ. For example, the thickness H132 of the dielectric material 132a is ranging about 0.5 µm to about 1.5 µm while the thickness H124 of the conductive pads 124 is less than or substantially equal to about 14 kÅ. For another example, the thickness H132 of the dielectric material 132a is ranging about 1.5 µm to about 2.5 µm while the thickness H124 of the conductive pads 124 is greater than or substantially equal to about 14 kÅ. The disclosure is not specifically limited thereto. In addition, a thickness H122 of the barrier seed patterns 122 is ranging from about 200 Å to about 2000 Å; the disclosure is not limited thereto.

As illustrated in FIG. 7, in some embodiments, the patterned conductive layer 134-1 is formed after performing the planarization process on the metal material ML and the seed layer material SL. For example, the patterned conductive layer 134-1 includes multiple metallic patterns 134a formed in the openings O1 and multiple metallic patterns 134b formed in the openings O2 (as shown in FIG. 7), however the disclosure is not limited thereto. In one embodiment, the patterned conductive layer 134-1 may include one or more than one of the metallic patterns 134a formed in the openings O1 and/or one or more than one of the metallic patterns 134b formed in the openings O2. In an alternative embodiment, the patterned conductive layer 134-1 may include one or more than one of the metallic patterns 134a formed in the openings O1 and no metallic pattern 134b formed in the opening O2.

In some embodiments, the metallic patterns 134a may be a dual damascene structure and physically connected with the connection pads 120 underlying thereto, and the metallic patterns 134b may be a single damascene structure and formed over the dielectric material 132a. In other words, the metallic patterns 134a may include a bump via and a bump metal line (e.g. a bump conductive trench) over the bump via, and the metallic patterns 134b may include a bump metal line. In the disclosure, within the patterned conductive layer 134-1, the metallic patterns 134a and the metallic patterns 134b may not be or may be at least partially electrically connected to each other. In the disclosure, the dielectric layer 132-1 and the patterned conductive layer 134-1 together are referred to as a first build-up layer of the redistribution circuit structure 130, where the first build-up layer has a high degree of coplanarity to facilitate a formation of the later-formed feature (such as a layer (e.g. an additional build-up layer) or element (e.g. a semiconductor die or chip). As shown in FIG. 7, the metallic patterns 134a of the patterned conductive layer 134-1 are electrically connected to the connection pads 120, for example.

Figure 8:
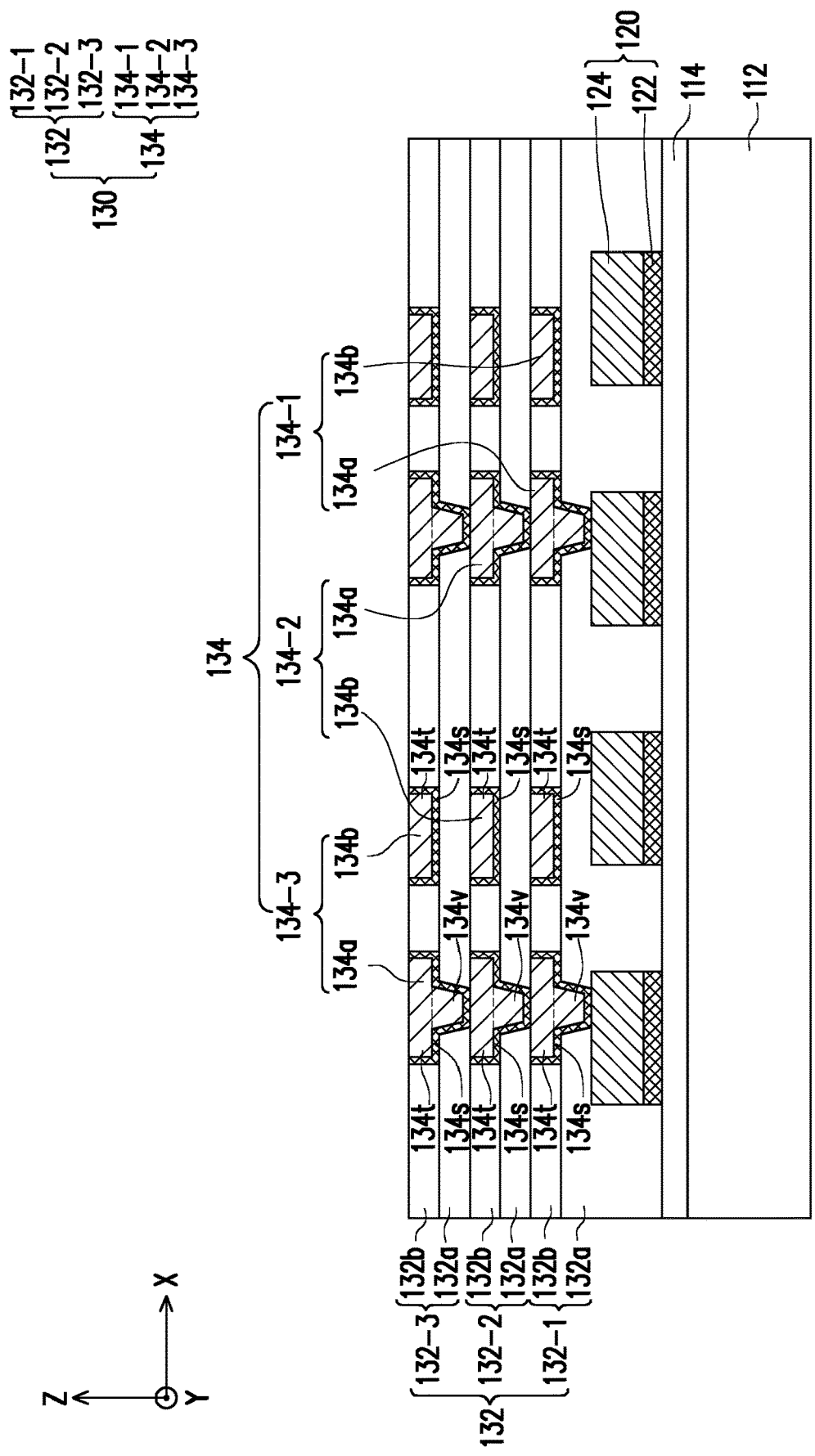

As illustrated in FIG. 8, in some embodiments, the dielectric layer 132-2, the patterned conductive layer 134-2, the dielectric layer 132-3, and the patterned conductive layer 134-3 are sequentially formed on the first build-up layer (including the dielectric layer 132-1 and the patterned conductive layer 134-1) to form the redistribution circuit structure 130. The formations and materials of the dielectric layers 132-2 and 132-3 are the same or similar to the formation and material of the dielectric layer 132-1, and the formations and materials of the patterned conductive layers 134-2 and 134-3 are the same or similar to the formation and material of the patterned conductive layer 134-1, and thus are not repeated herein for simplicity.

In some embodiments, the patterned conductive layer 134-2 is physically connected to the patterned conductive layer 134-1, and the patterned conductive layer 134-3 is physically connected to the patterned conductive layer 134-2. In other words, the patterned conductive layers 134-1, 134-2 and 134-3 within the redistribution circuit structure 130 are electrically connected to each other. For example, the numbers of the metallic patterns 134a and/or 134b each formed in the patterned conductive layer 134-1, the patterned conductive layer 134-2, and the patterned conductive layer 134-3 may be the same or different, the disclosure is not limited thereto.

In the disclosure, the dielectric layer 132-2 and the patterned conductive layer 134-2 depicted in FIG. 8 together are referred to as a second build-up layer of the redistribution circuit structure 130 and the dielectric layer 132-3 and the patterned conductive layer 134-3 depicted in FIG. 8 together are referred to as a third build-up layer of the redistribution circuit structure 130. In some embodiments, as shown in FIG. 8, the second build-up layer and the third build-up layer may be substantially the same or similar to the first build-up layer (including the dielectric layer 132-1 and the patterned conductive layer 134-1) described in FIG. 3 to FIG. 7. However, the disclosure is not limited thereto; in alternative embodiments, the second build-up layer and the third build-up layer may be different from the first build-up layer. The number of the build-up layers included in the redistribution circuit structure 130 is not limited in the disclosure. In one embodiment, the number of the build-up layers included in the redistribution circuit structure 130 may be one or more than one. As shown in FIG. 8, for example, the redistribution circuit structure 130 is physically and electrically connected to the connection pads 120.

Figure 9:
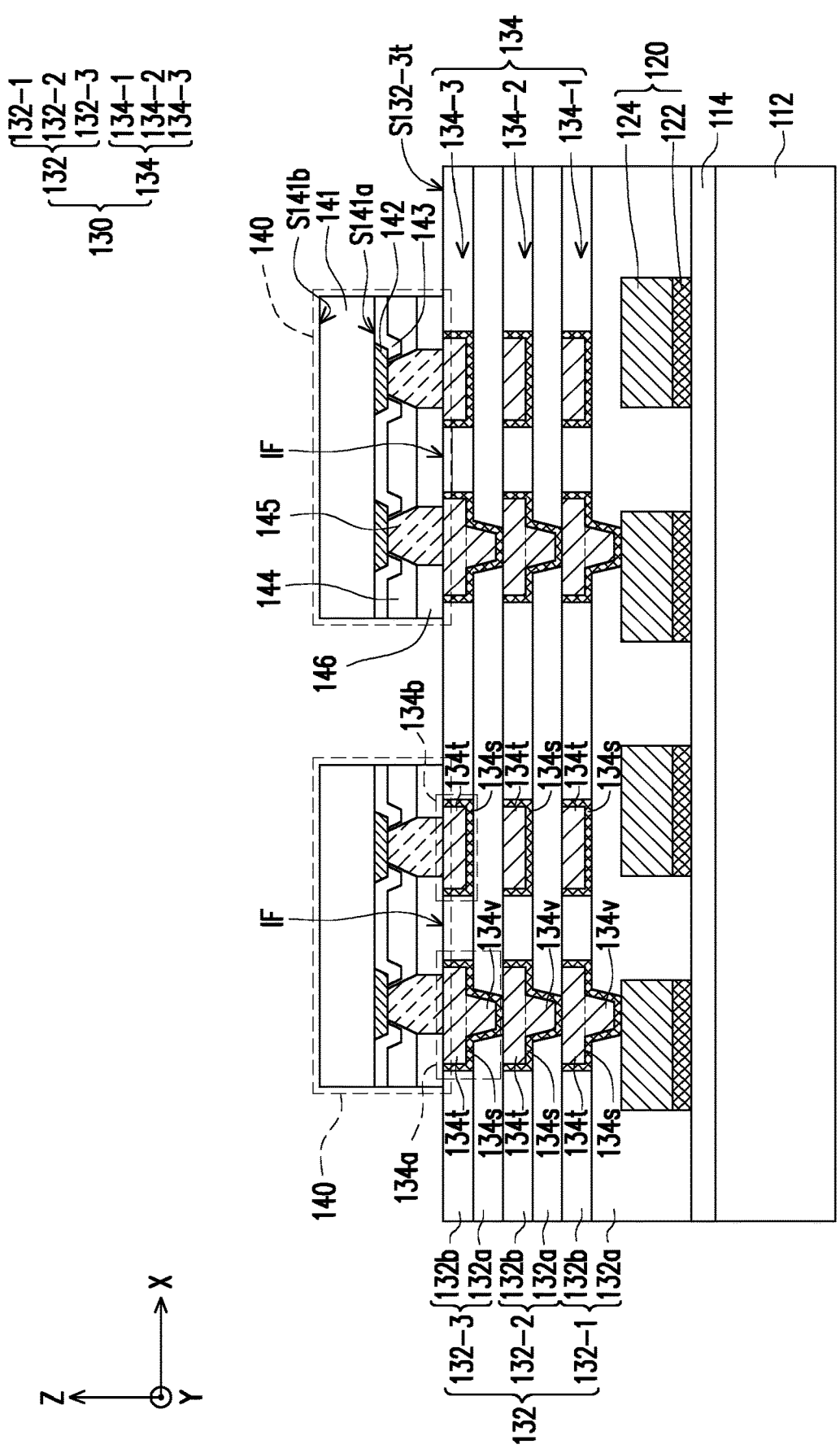

Referring to FIG. 9, in some embodiments, at least one semiconductor die 140 is provided. Hereafter, two semiconductor dies 140 are shown in FIG. 9 for illustration purpose; the disclosure is not limited thereto. In other embodiments, the number of the semiconductor dies 140 may be one or more than one based on the demand and the design layout. For example, as shown in FIG. 9, the semiconductor dies 140 are picked and placed on the redistribution circuit structure 130 (e.g. a surface S132-3t of the redistribution circuit structure 130).

In some embodiments, the semiconductor dies 140 each include a semiconductor substrate 141 having an active surface S141a and a backside surface S141b opposite to the active surface S141a, a plurality of conductive pads 142 formed on the active surface S141a, a passivation layer 143 disposed on and partially exposing the conductive pads 142, a post-passivation layer 144 disposed on the passivation layer 143 and partially exposing the conductive pads 142, connecting vias 145 disposed on the conductive pads 142, and a protection layer 146 covering the post-passivation layer 144 and wrapping sidewalls of the connecting vias 145. In other words, the conductive pads 142 distributed on the active surface S141a of the semiconductor substrate 141 are partially exposed by contact openings of the passivation layer 143 and contact openings of the post-passivation layer 144, so as to physically connect to the connecting vias 145.

In some embodiments, the material of the semiconductor substrate 141 may include a silicon substrate including active components (e.g., transistors and/or memories such as NMOS and/or PMOS devices, or the like) and/or passive components (e.g., resistors, capacitors, inductors or the like) formed therein. In an alternative embodiment, the semiconductor substrate 141 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. The disclosure is not limited thereto.

In some embodiments, the conductive pads 142 may be aluminum pads or other suitable metal pads. The connecting vias 145 may be copper pillars, copper alloy pillar or other suitable metal pillars, for example. In some embodiments, the passivation layer 143, the post-passivation layer 144 and/or the protection layer 146 may be a PBO layer, a polyimide (PI) layer or other suitable polymers. In certain embodiments, the passivation layer 143, the post-passivation layer 144 and/or the protection layer 146 may be made of inorganic materials, such as silicon oxide, silicon nitride, silicon oxynitride, or any suitable dielectric material. In one embodiment, the materials of the passivation layer 143, the post-passivation layer 144 and/or the protection layer 146 may be the same. In an alternative embodiment, the materials of the passivation layer 143, the post-passivation layer 144 and/or the protection layer 146 may be different from one another, the disclosure is not limited thereto.

Continued on FIG. 9, in some embodiments, the semiconductor dies 140 are bonded to the redistribution circuit structure 130 by hybrid bonding (through a hybrid bonding interface IF). For example, the hybrid bonding process may include hydrophilic fusion bonding process or hydrophobic fusion bonding process. In some embodiments, the connecting vias 145 of each of the semiconductor dies 140 are physically bonded to a topmost layer (e.g. the patterned conductive layer 134-3) of the patterned conductive layers 134 of the redistribution circuit structure 130 exposed by a topmost layer (e.g. the dielectric layer 132-3) of the dielectric layers 132, and portions of the dielectric layer 132-3 of the redistribution circuit structure 130 are not covered by the semiconductor dies 140. As shown in FIG. 9, for example, the semiconductor dies 140 are physically and electrically connected to the redistribution circuit structure 130. In some embodiments, the semiconductor dies 140 each are electrically connected to some of the connection pads 120 through the redistribution circuit structure 130. In the disclosure, the semiconductor dies 140 are electrically communicated to each other through the redistribution circuit structure 130.

In some embodiments, each of the semiconductor dies 140 described herein may be referred to as a chip or an integrated circuit (IC). In some embodiments, the semiconductor dies 140 may include chip(s) of the same type or different types. For example, the semiconductor dies 140 include wireless and radio frequency (RF) chips. For example, in an alternative embodiment, the semiconductor dies 140 include digital chips, analog chips, or mixed signal chips, such as application-specific integrated circuit ("ASIC") chips, sensor chips, wireless and radio frequency (RF) chips, memory chips, logic chips, voltage regulator chips, or a combination thereof. In an alternative embodiment, the semiconductor dies 140, one or all, may be referred to as a chip or a IC of combination-type. For example, at least one of the semiconductor dies 140 may be a WiFi chip simultaneously including both of a RF chip and a digital chip. The disclosure is not limited thereto.

Figure 10:
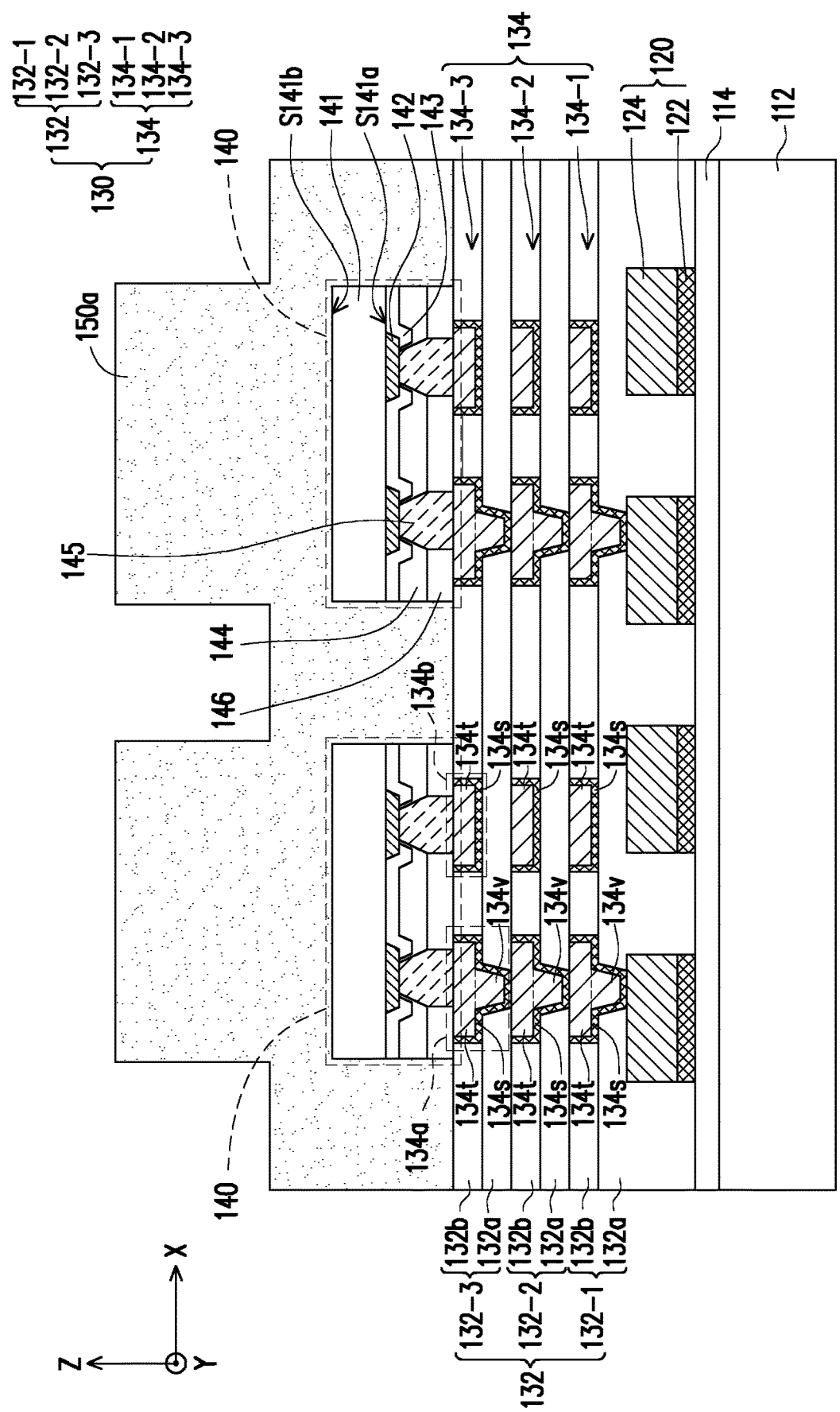

Referring to FIG. 10, in some embodiments, an insulating material 150a is conformally formed over the semiconductor dies 140, where the semiconductor dies 140 are encapsulated in the insulating material 150a, and the redistribution circuit structure 130 exposed by the semiconductor dies 140 are covered by the insulating material 150a. In some embodiments, as shown in FIG. 10, the backside surface S141b and a sidewall of each of the semiconductor dies 140 are surrounded and covered by the insulating material 150a. In some embodiments, the insulating material 150a may be an oxide (such as silicon oxide or the like). In some embodiments, the insulating material 150a may be formed by deposition. As shown in FIG. 10, the semiconductor dies 140 and the redistribution circuit structure 130 are not accessibly revealed by the insulating material 150a.

Figure 11:
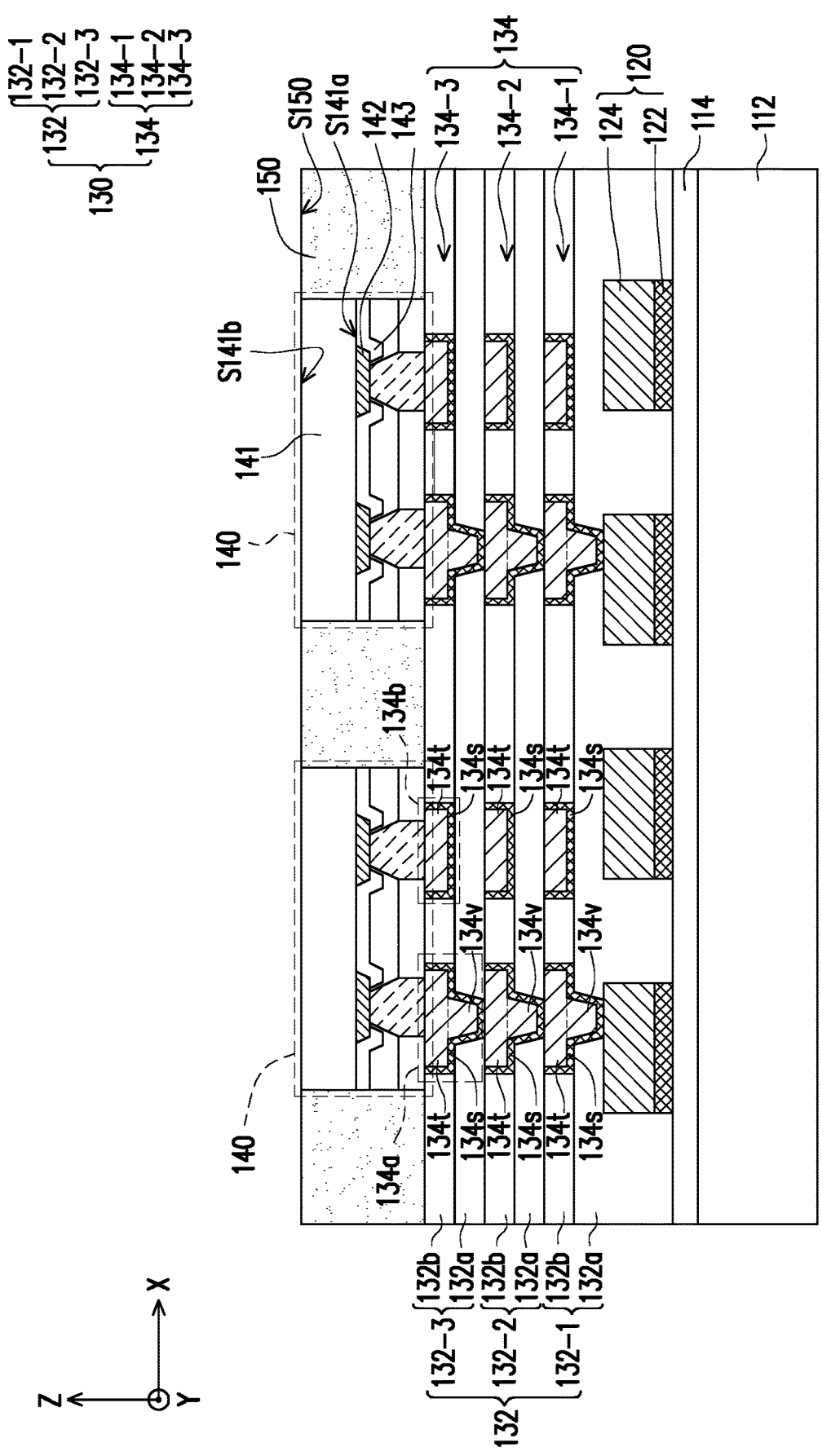

Referring to FIG. 11, in some embodiments, a planarizing step is performed on the insulating material 150a to form an insulating encapsulation 150 exposing the backside surfaces S141b of the semiconductor dies 140. In certain embodiments, as shown in FIG. 11, after the planarization, the backside surfaces S141b of the semiconductor dies 140 are exposed by a surface S150 of the insulating encapsulation 150. That is, for example, the backside surfaces S141b of the semiconductor dies 140 become substantially leveled with the surface S150 of the insulating encapsulation 150. In other words, the backside surfaces S141b of the semiconductor dies 140 and the surface S150 of the insulating encapsulation 150 are substantially coplanar to each other. In some embodiments, as shown in FIG. 11, the semiconductor dies 140 are accessibly revealed by the insulating encapsulation 150.

The insulating material 150a may be planarized by mechanical grinding or CMP process, for example. After the planarizing step, a cleaning step may be optionally performed, for example to clean and remove the residue generated from the planarizing step. However, the disclosure is not limited thereto, and the planarizing step may be performed through any other suitable method. In some alternative embodiments, during planarizing the insulating material 150a, the semiconductor substrates 141 of the semiconductor dies 140 may also be planarized. In certain embodiments, the planarizing step may be, for example, performed on the over-molded insulating material 150a to level the backside surfaces S141b of the semiconductor dies 140 and the surface S150 of the insulating encapsulation 150. With such, the backside surfaces S141b of the semiconductor dies 140 and the surface S150 of the insulating encapsulation 150 have a high degree of coplanarity to facilitate subsequent process steps.

Figure 12:
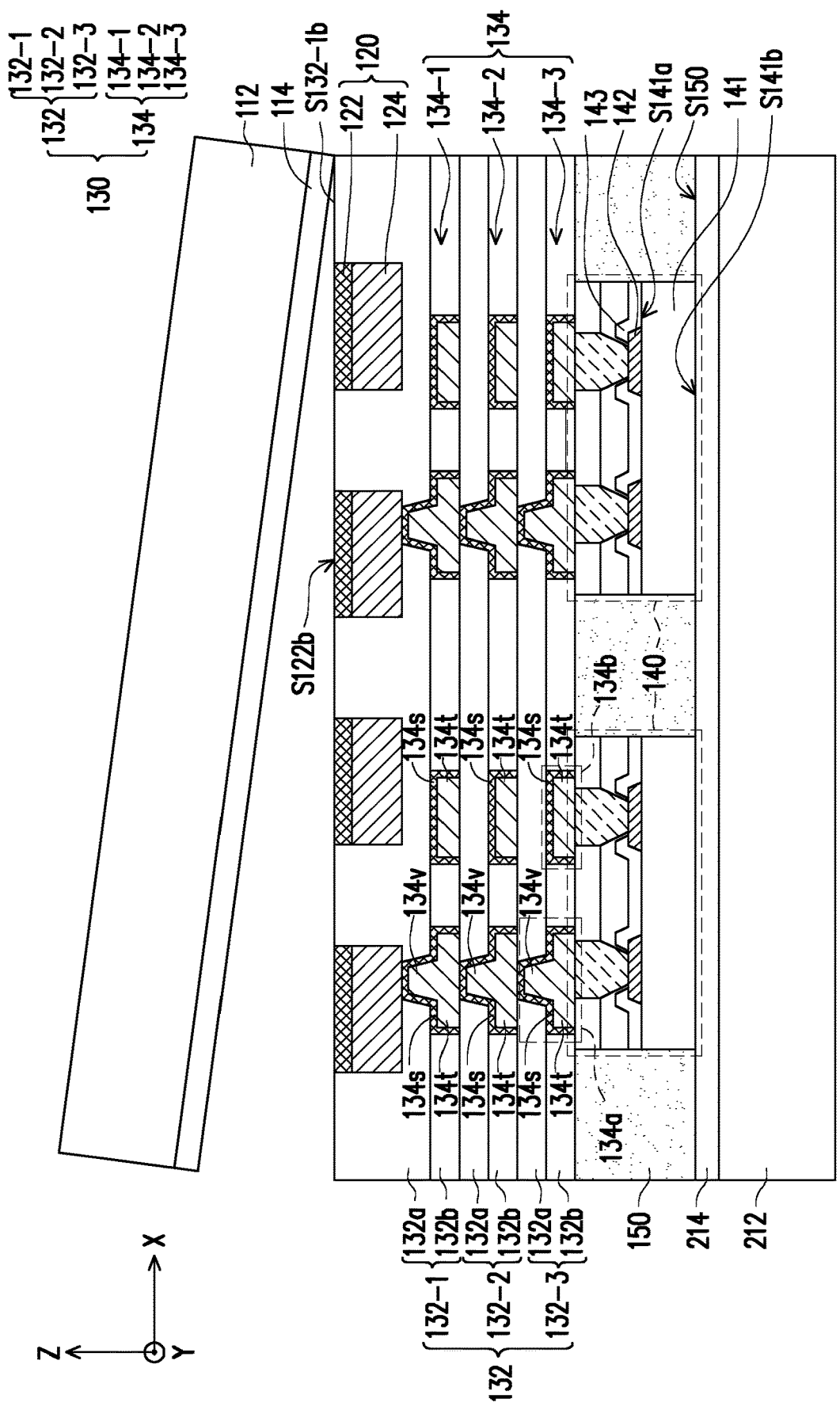

Referring to FIG. 12, in some embodiments, the whole structure depicted in FIG. 11 is flipped (turned upside down) and placed on a carrier 212 coated with a debond layer 214, and the carrier 112 is debonded from the connection pads 120 and the redistribution circuit structure 130. In some embodiments, the connection pads 120 (e.g. the barrier seed patterns 122) and the redistribution circuit structure 130 (e.g. the dielectric material 132a of the dielectric layer 132-1) are easily separated from the carrier 112 due to the debond layer 114, and the connection pads 120 (e.g. the surfaces S122b of the barrier seed patterns 122) and the redistribution circuit structure 130 (e.g. the surface S132-1b of the dielectric layer 132-1) are exposed. In some embodiments, the carrier 112 is detached from the connection pads 120 and the redistribution circuit structure 130 through a debonding process, and the carrier 112 and the debond layer 114 are removed.

In some embodiments, the materials of the carrier 212 and the carrier 112 may be the same, however the disclosure is not limited thereto. In an alternative embodiment, the material of the carrier 212 may be different from the material of the carrier 112. In some embodiments, the material and formation of the debond layer 214 may be the same or different from the material and formation of the debond layer 114, the disclosure is not limited thereto.

Figure 13:
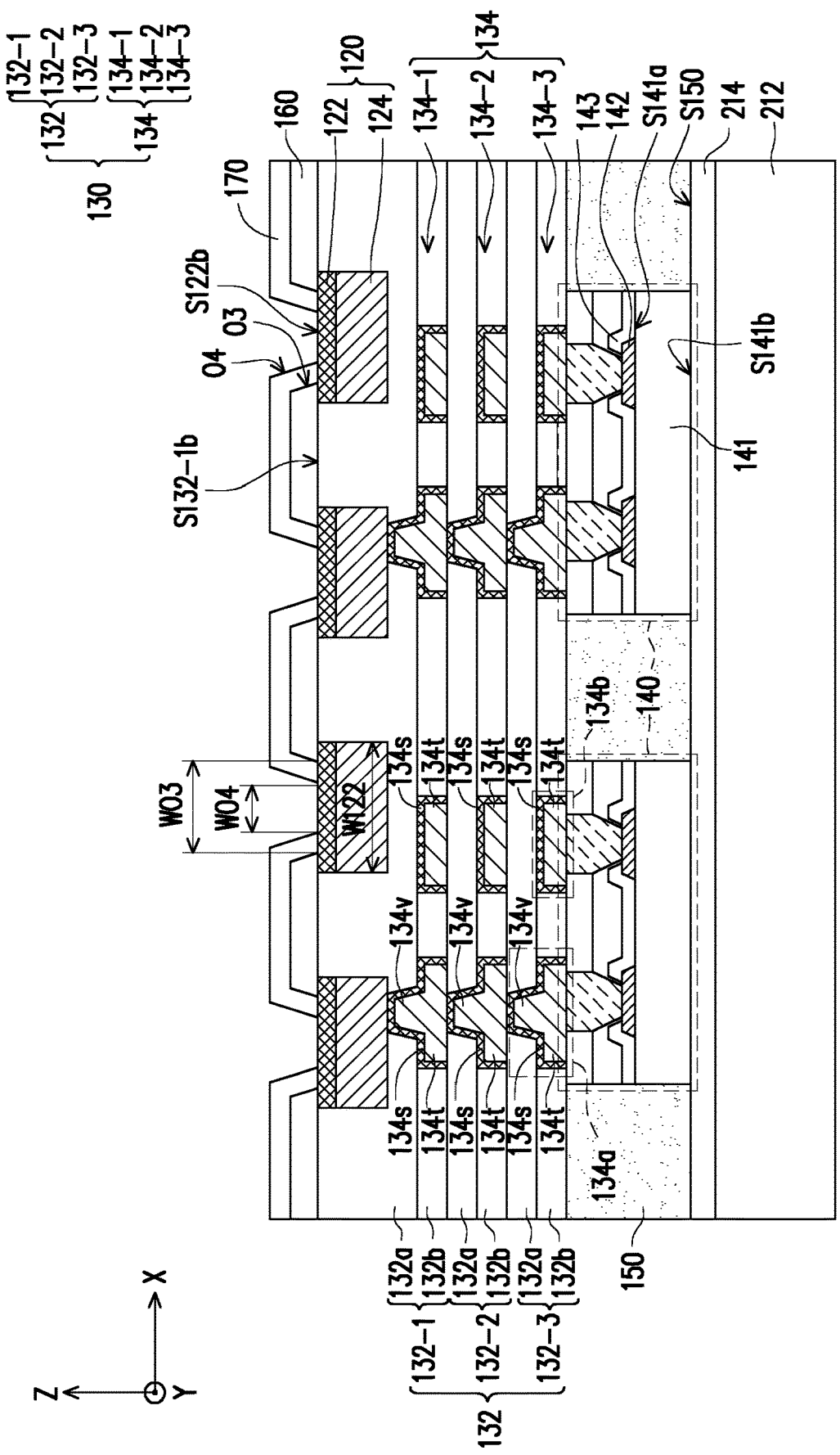

Referring to FIG. 13, in some embodiments, a passivation layer 160 is formed on the redistribution circuit structure 130 and at least partially exposes the connection pads 120. In some embodiments, the passivation layer 160 is formed on the redistribution circuit structure 130 to completely cover the surface S132-1b of the dielectric layer 132-1 and on the connection pads 120, where openings O3 formed in the passivation layer 160 partially expose the surfaces S122b of the barrier seed patterns 122 of the connection pads 120 accessibly revealed by the redistribution circuit structure 130. As shown in FIG. 13, a size W122 of the connection pads 120 is greater than a size WO3 of the openings O3. In other words, a portion of each of the barrier seed patterns 122 of the connection pads 120 is in physical contact with the passivation layer 160 (for example, within a region R1 depicted in FIG. 15). In some embodiments, along the stacking direction (e.g. the direction Z), the passivation layer 160 is overlapped with the barrier seed patterns 122 and the conductive pads 124 (e.g. within the region R1 depicted in FIG. 15). In some embodiments, the passivation layer 160 may be a PBO layer, a PI layer or other suitable polymer layer formed by spin-coating or deposition, while the openings O3 may be formed in the passivation layer 160 by etching. However, it is appreciated that the scope of this disclosure is not limited to the materials and descriptions disclosed above.

Continued on FIG. 13, in some embodiments, a dielectric layer 170 is formed on the passivation layer 160 and at least partially exposes the connection pads 120 exposed by the passivation layer 160. In some embodiments, the dielectric layer 170 is formed on and completely covers the passivation layer 160, and extends into the openings O3 while portions of the connection pads 120 accessibly exposed by the openings O3 is further exposed by openings O4 formed in the dielectric layer 170. That is, positioning locations of the openings O4 are corresponding to positioning locations of the openings O3, respectively. In some embodiments, the size W122 of the connection pads 120 is greater than a size WO4 of the openings O4, and the size WO3 of the openings O3 is greater than the size WO4 of the openings O4. In some embodiments, a portion of each of the barrier seed patterns 122 of the connection pads 120 is in physical contact with the dielectric layer 170 (for example, within a region R2 depicted in FIG. 15). In some embodiments, along the stacking direction (e.g. the direction Z), the dielectric layer 170 is overlapped with the barrier seed patterns 122 and the conductive pads 124 (e.g. within the regions R1 and R2 depicted in FIG. 15). In some embodiments, the dielectric layer 170 may include inorganic materials, such as silicon oxide, silicon nitride, silicon oxynitride, or any suitable dielectric material formed by spin-coating or deposition, while the openings O4 may be formed in the dielectric layer 170 by etching. However, it is appreciated that the scope of this disclosure is not limited to the materials and descriptions disclosed above.

The number and shape of the openings O3 and the openings O4 may, for example, correspond to the number and shape of later-formed conductive structure(s) (such as conductive balls or conductive pillars), the disclosure is not limited thereto.

Figure 14:
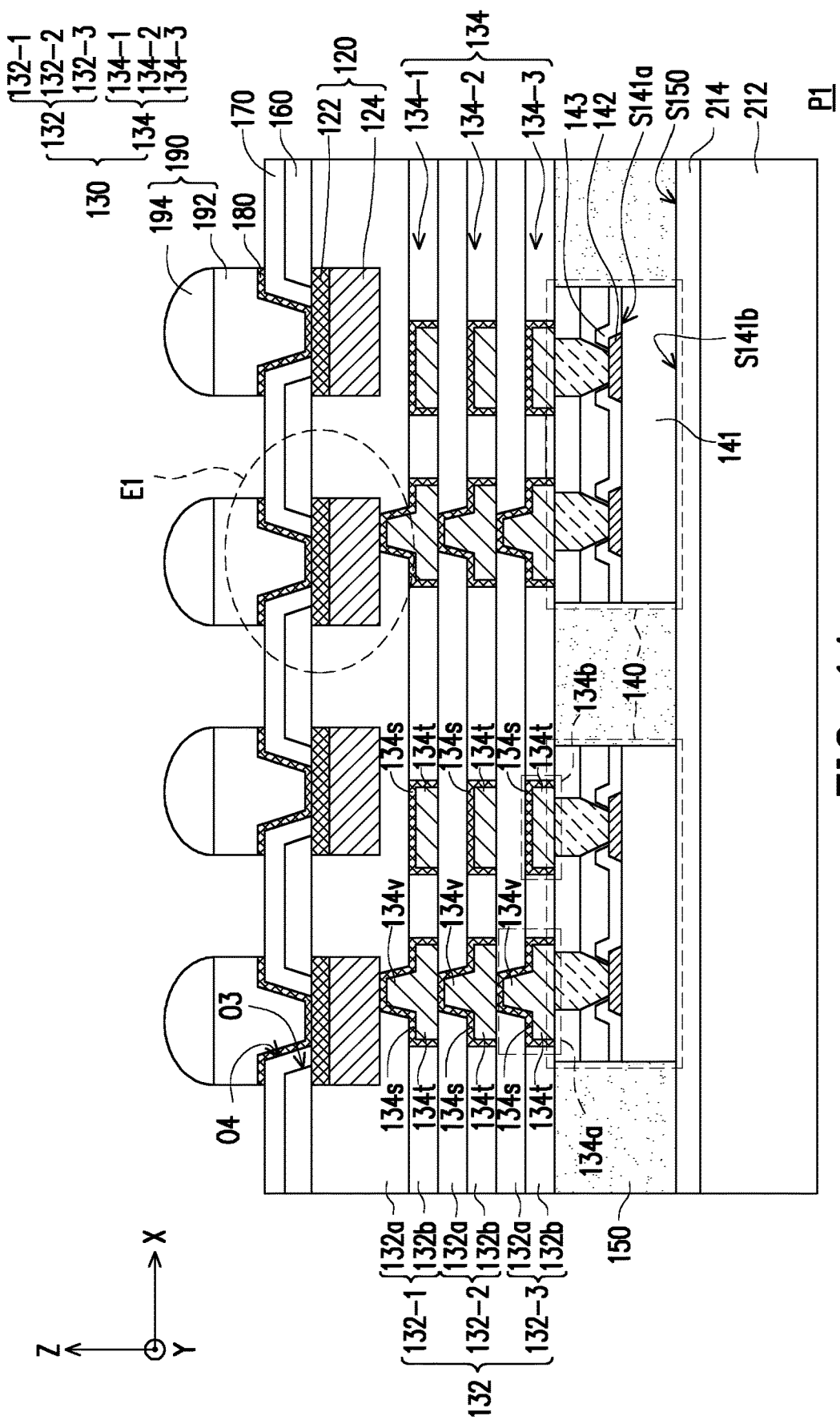
Figure 15:
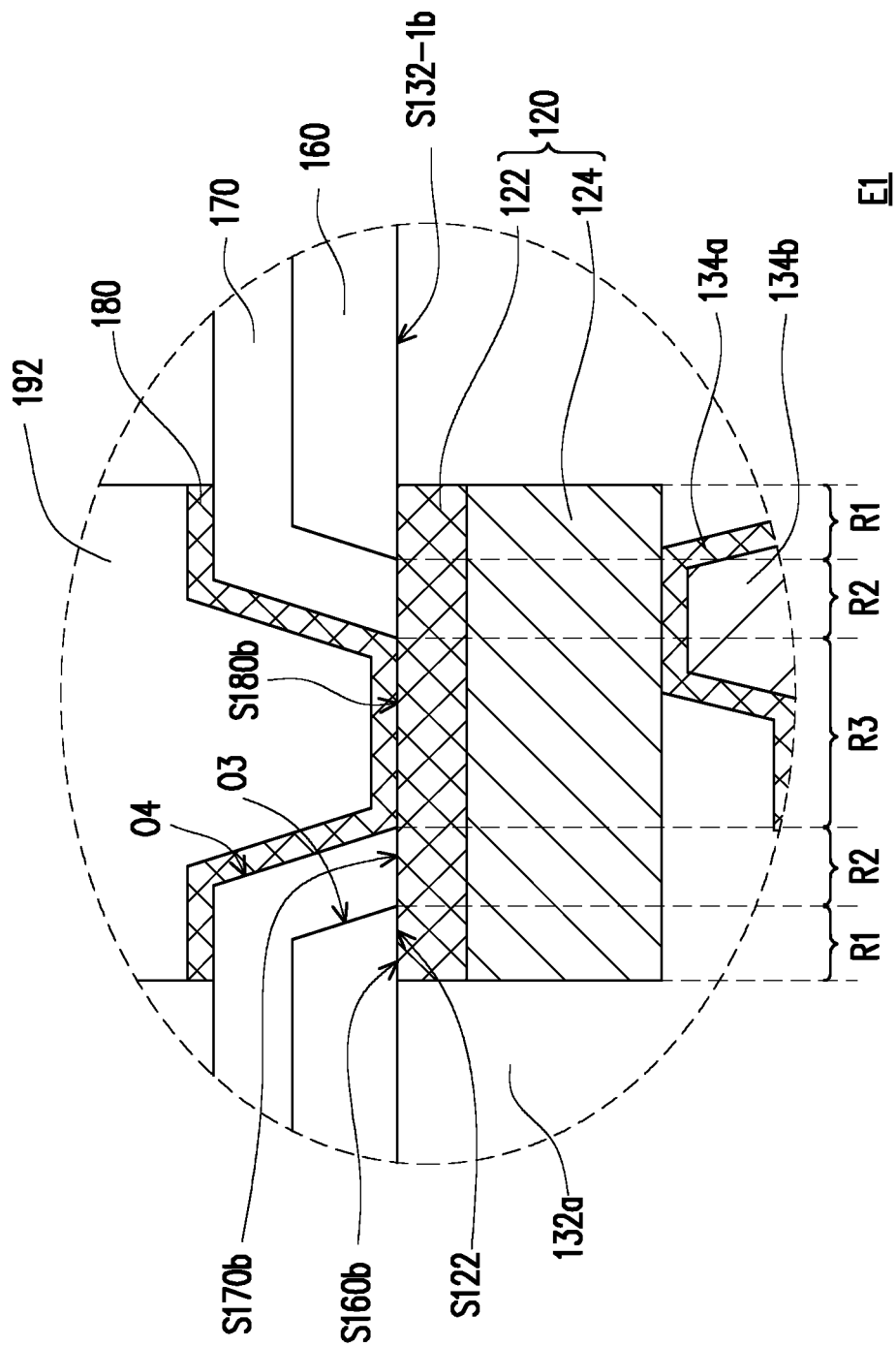
FIG. 15 is an enlarged, schematic cross sectional view of a portion of the package structure depicted in FIG. 14.

Referring to FIG. 14, in some embodiments, a plurality of barrier seed patterns 180 and a plurality of conductive terminals 190 are sequentially formed on the dielectric layer 170, where the barrier seed patterns 180 are sandwiched between the dielectric layer 170 and the conductive terminals 190. In some embodiments, the barrier seed patterns 180 each are located between a respective one of the conductive terminals 190 and the dielectric layer 170. Due to the barrier seed patterns 180, the adhesive strength between the conductive terminals 190 and the dielectric layer 170 is enhanced. In some embodiments, the barrier seed patterns 180 are directly located on the dielectric layer 170 and further extend into the openings O4 formed in the dielectric layer 170 to physically and electrically contact the portions of the barrier seed patterns 122 of the connection pads 120 exposed by the openings O4 formed in the dielectric layer 170 and exposed by the openings O3 formed in the passivation layer 160. In some embodiments, a portion of each of the barrier seed patterns 122 of the connection pads 120 is in physical contact with a respective one of the barrier seed patterns 180 overlying thereto (for example, within a region R3 depicted in FIG. 15). In some embodiments, along the stacking direction (e.g. the direction Z), the barrier seed patterns 180 each are respectively overlapped with the barrier seed pattern 122 and the conductive pad 124 of a respective one of the connection pads 120 (e.g. within the regions R1, R2 and R3 depicted in FIG. 15).

As shown in FIG. 14, in some embodiments, the barrier seed patterns 180 are electrically connected to the redistribution circuit structure 130 through the connections pads 120. In some embodiments, the conductive terminals 190 are electrically connected to the redistribution circuit structure 130 through the barrier seed patterns 180 and the connection pads 120. In some embodiments, some of the conductive terminals 190 are electrically connected to at least one of the semiconductor dies 140 through the barrier seed patterns 180, the connection pads 120, and the redistribution circuit structure 130.

In some embodiments, the barrier seed patterns 180 and the conductive terminals 190 may be formed by the following steps, however the disclosure is not limited thereto. For example, a seed layer material (not shown) is conformally formed on the structure depicted in FIG. 13 and extends into the openings O4. A resist layer (not shown) having openings formed therein is formed on the seed layer material to expose portions of the seed layer material corresponding to the positioning locations of the openings O4. A plurality of conductive elements 192 are formed on the seed layer material, in the openings O4 formed in the dielectric layer 170 and in the openings formed in the resist layer by a plating process. A plurality of conductive elements 194 are respectively disposed on the conductive elements 192 to form the conductive terminals 190 by dispensing. The resist layer is removed by an acceptable ashing process and/or a photoresist stripping process. Then, the seed layer material is patterned by using the conductive terminals 190 as an etching mask to form the barrier seed patterns 180 by one or more than one etching processes. In some embodiments, the material of the conductive elements 192 may include copper, copper alloy, or the like; and the material of the conductive elements 194 may include solder or the like. However, the disclosure is not limited thereto, the above method and processes may be substituted by any other suitable method and processes based on the demand.

As shown in FIG. 14, for example, in a vertical projection on the carrier 212 along the stacking direction (e.g. the direction Z) of the redistribution circuit structure 130 and the semiconductor dies 140, a projection area of one conductive terminal 190 is substantially the same as a projection area of a respective one barrier seed pattern 180 underlying thereto, respectively. That is, in direction Z, the conductive terminals 190 each are completely overlapped with the barrier seed patterns 180 underlying thereto in a vertical projection on the X-Y plane along direction Z. In some embodiments, a sidewall of one barrier seed pattern 180 is aligned with a sidewall of a respective one conductive terminal 190.

In some alternative embodiments, the conductive terminals 190 are, for example, micro-bumps, chip connectors (e.g. controlled collapse chip connection (C4) bumps), ball grid array (BGA) balls, solder balls or other connectors. The number of the conductive terminals 190 is not limited to the disclosure, and may be designated and selected based on the numbers of the openings O3 and O4. When solder is used, the solder may include either eutectic solder or non-eutectic solder. The solder may include lead or be lead-free, and may include Sn—Ag, Sn—Cu, Sn—Ag—Cu, or the like. In the disclosure, for one embodiment, the conductive terminals 190 may be referred to as conductive connectors for connecting with another package; or for another embodiment, the conductive terminals 190 may be referred to as conductive terminals for inputting/outputting electric and/or power signals.

In some embodiments, after forming the conductive terminals 190 and the barrier seed patterns 180, a dicing (singulation) process is then performed to cut the wafer having a plurality of the packages structures P1 into individual and separated packages structures P1. In one embodiment, the dicing process is a wafer dicing process including mechanical blade sawing or laser cutting. Up to here, the manufacture of the package structures P1 is completed. Owing to the configuration of the connection pads 120, the misalignment between the barrier seed patterns 180/the conductive terminals 190 and the connection pads 120 electrically connected to the semiconductor dies 140 through the redistributing circuit structure 130 is greatly suppressed, thereby enhancing the reliability and yield of the package structure P1. In other words, owing to the formation of the connection pads 120, the formations of the openings O3 and the openings O4 respectively in the passivation layer 160 and the dielectric layer 170 for accurately exposing the connection pads 120 to electrically connect to the conductive terminals 190 (or other external semiconductor devices) are easily achieved, thereby enhancing the reliability and yield of the package structure P1.

In some embodiments, as shown in FIG. 14, the carrier 212 is remained in the package structure P1 to serve as a heat dissipating element for the package structure P1, where the carrier 212 is, for example, a Si substrate. In such embodiments, the carrier 212 may further be used for warpage control. However, the disclosure is not limited thereto, in alternative embodiments, the carrier 212 may be further removed from the package structure P1.

In further alternative embodiments, in addition to the conductive terminals 190, in FIG. 14, an additional semiconductor element(s) (not shown) may be disposed on the barrier seed patterns 180 for electrically coupling at least one of the semiconductor dies 140. In some embodiments, the additional semiconductor element(s) may include a passive component or active component. The number of the additional semiconductor element(s) is not limited in the disclosure, and may be designated based on the demand and design layout.

Figure 16:
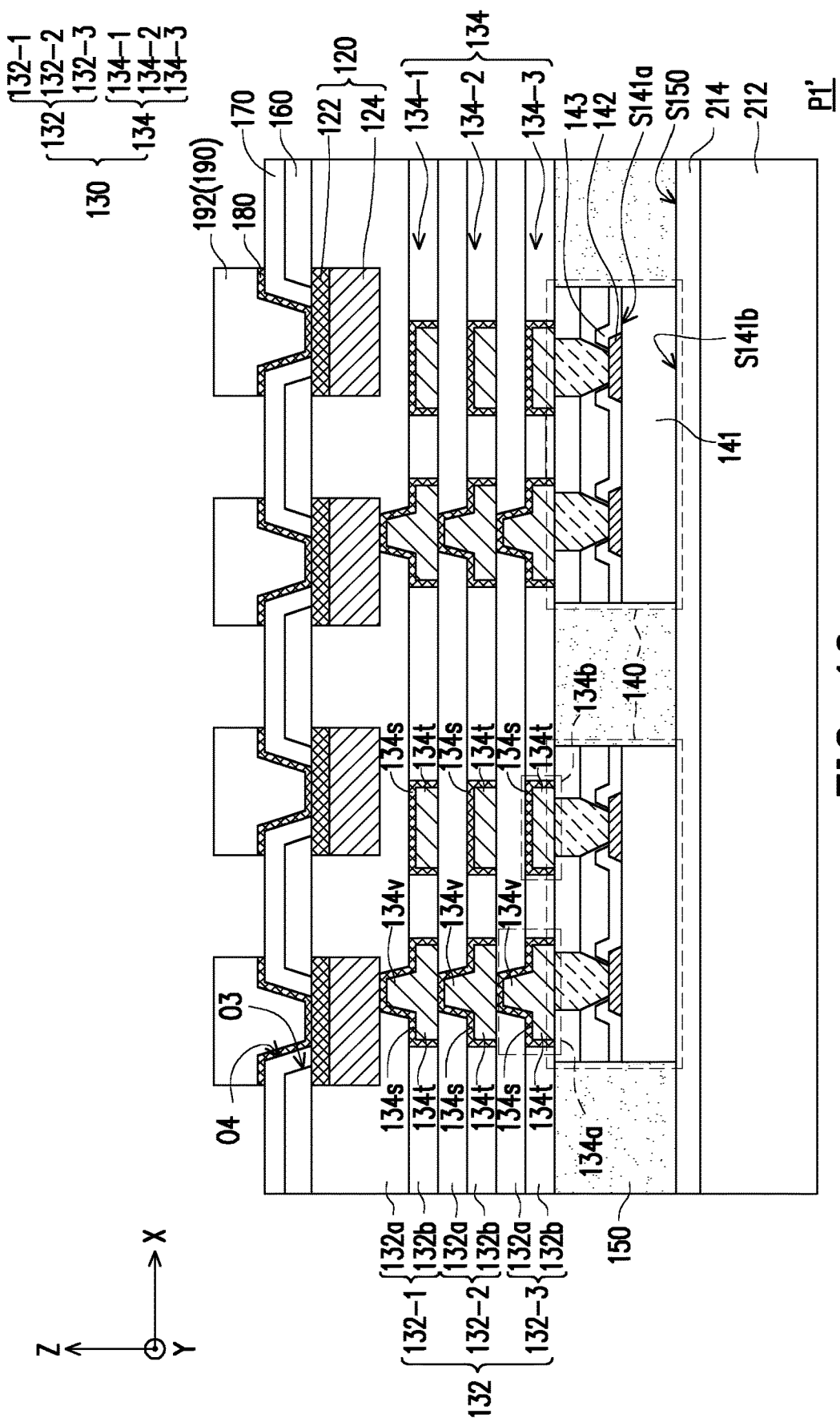
FIG. 16 is a schematic cross sectional view of a package structure in accordance with some other embodiments of the present disclosure.

In alternative embodiments, the conductive elements 194 in the package structure P1 depicted in FIG. 14 may be omitted to form the conductive terminals 190 (see a package structure P1' as shown in FIG. 16). In such embodiments, the conductive terminals 190 of package structure P1' may include metal posts/pillars, such as copper posts/pillars or other metallic posts/pillars.

Figure 17:
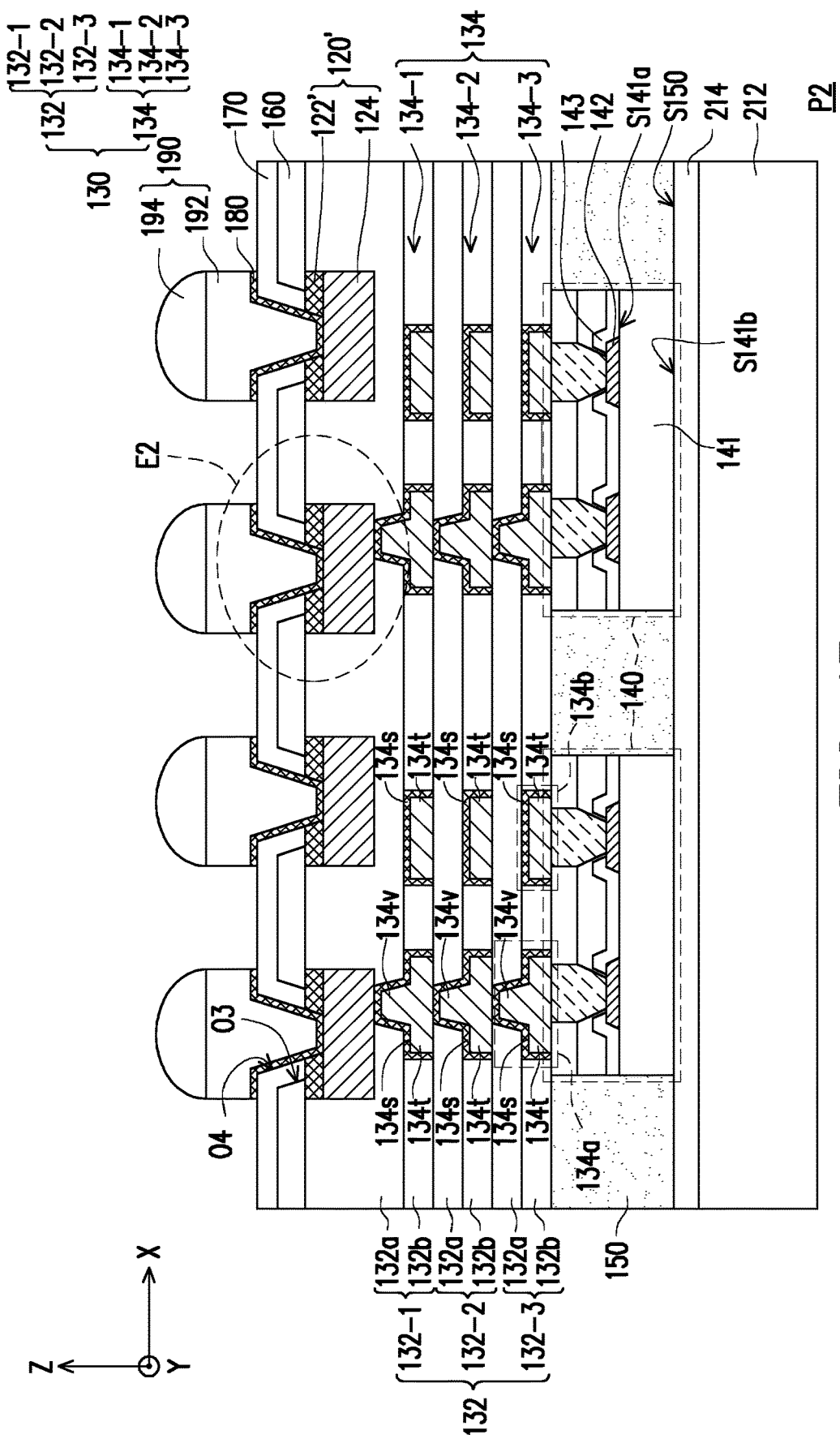
FIG. 17 is a schematic cross sectional view of a package structure in accordance with some other embodiments of the present disclosure.
Figure 18:
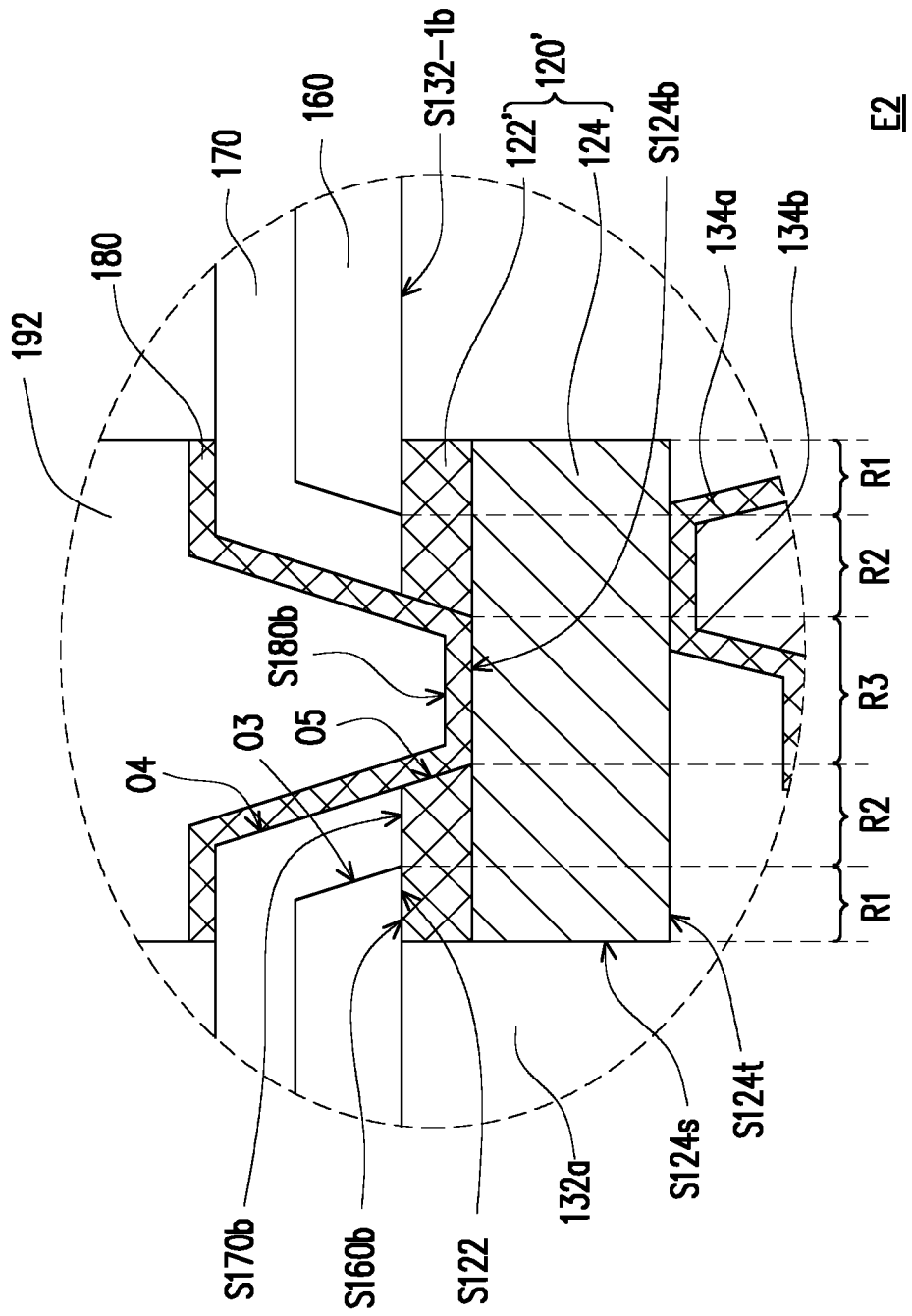
FIG. 18 is an enlarged, schematic cross sectional view of a portion of the package structure depicted in FIG. 17.

FIG. 17 is a schematic cross sectional view of a package structure in accordance with some other embodiments of the present disclosure. FIG. 18 is an enlarged, schematic cross sectional view of a portion of the package structure depicted in FIG. 17, where the portion of the package structure is indicated by a dotted box E2 depicted in FIG. 17. The elements similar to or substantially the same as the elements described previously will use the same reference numbers, and certain details or descriptions (e.g. the materials, formation processes, positioning configurations, etc.) of the same elements would not be repeated herein. Referring to FIG. 14 and FIG. 17 to FIG. 18, a package structure P2 depicted in FIG. 17 and FIG. 18 is similar to the package structure P1 depicted in FIG. 14; the difference is that, in the package structure P2, the connection pads 120 are substituted by connection pads 120' (see FIG. 18).

As illustrated in FIG. 17, in some embodiments, during the formation of the openings O4 formed in the dielectric layer 170, portions of the barrier seed patterns 122 of the connection pads 120 are also removed to form the connection pads 120' with openings O5. In some embodiments, the connection pads 120' each have a barrier seed pattern 122' and a conductive pad 124 stacked thereon, where the conductive pad 124 is partially exposed by the openings O5 formed in the barrier seed pattern 122'. In other words, the openings O4 formed in the dielectric layer 170 each are spatially communicated to a respective one opening O5 formed in the barrier seed pattern 122', so that the conductive pads 124 of the connection pads 120' are exposed by the openings O5 formed in the barrier seed patterns 122' of the connection pads 120' for respectively connecting the barrier seed patterns 180 later-formed. That is, for each connection pad 120', the surface S124b of the conductive pad 124 is exposed by one opening O5 formed in a respective one barrier seed pattern 122' and a respective one opening O4 formed in the dielectric layer 170. For example, the barrier seed patterns 180 are respectively connected to the connection pads 120'. As shown in FIG. 17 and FIG. 18, each of the barrier seed patterns 180 is physically and electrically connected to a respective one of the connection pads 120' (e.g. sidewalls of the barrier seed patterns 122' within the openings O5 and the surfaces S124b of the conductive pads 124 exposed by the openings O5 formed in the barrier seed patterns 122').

As illustrated in FIG. 18, in some embodiments, within the region R1, a portion of each of the barrier seed patterns 122' of the connection pads 120' is in physical contact with the passivation layer 160. In some embodiments, along the stacking direction (e.g. the direction Z), the passivation layer 160 is overlapped with the barrier seed patterns 122' and the conductive pads 124 (e.g. within the region R1). As illustrated in FIG. 18, in some embodiments, within the region R2, a portion of each of the barrier seed patterns 122' of the connection pads 120' is in physical contact with the dielectric layer 170. In some embodiments, along the stacking direction (e.g. the direction Z), the dielectric layer 170 is overlapped with the barrier seed patterns 122' and the conductive pads 124 (e.g. within the regions R1 and R2 depicted in FIG. 18). In some embodiments, within the region R3, a portion (e.g. the surface S124b exposed by opening O5) of each of the conductive pads 124 are in physical contact with a respective one of the barrier seed patterns 180 overlying thereto. In some embodiments, along the stacking direction (e.g. the direction Z), the barrier seed patterns 180 are respectively overlapped with the barrier seed patterns 122' and the conductive pads 124 (e.g. within the regions R1, R2 and R3 depicted in FIG. 18).

Figure 19:
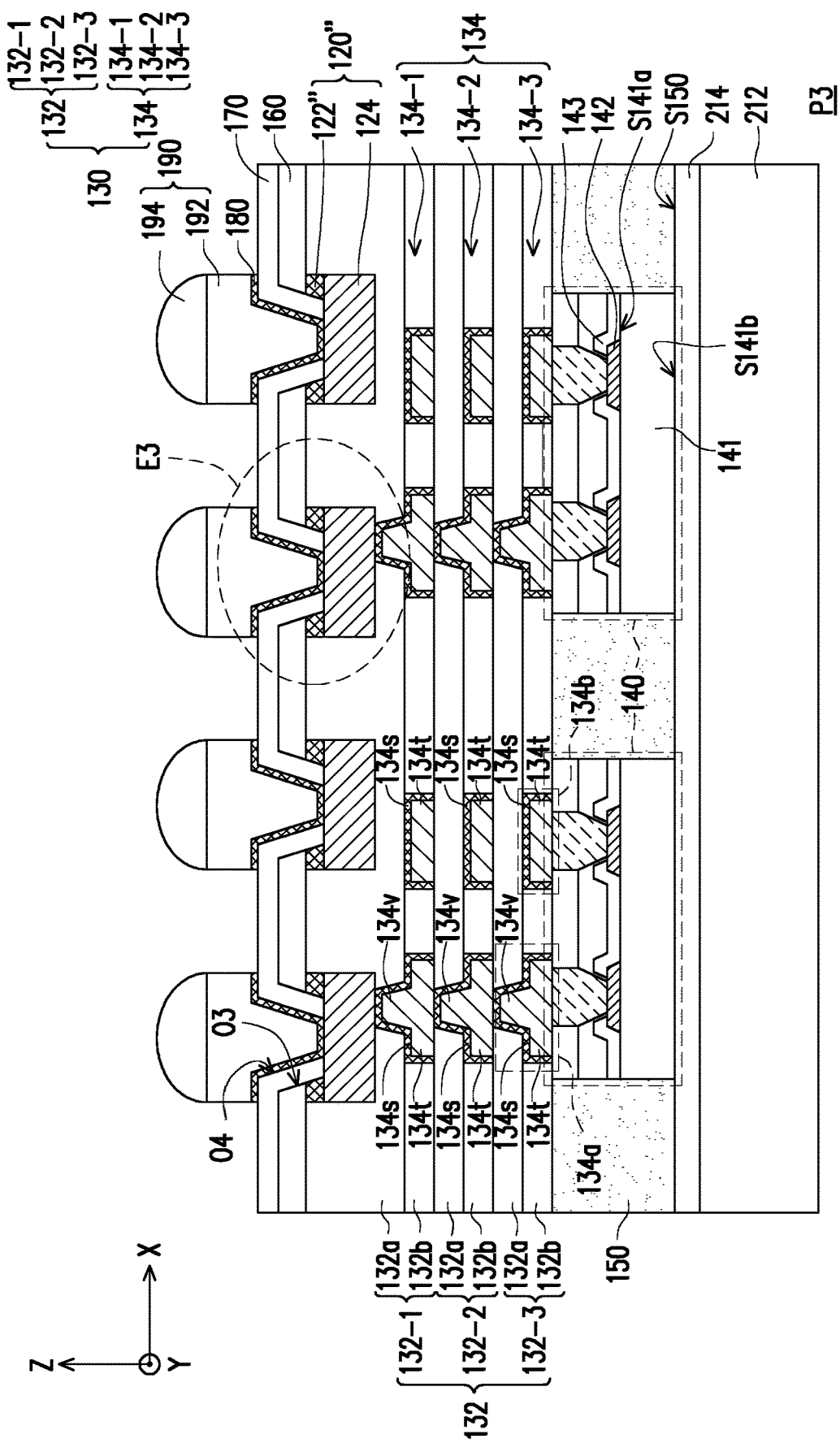
FIG. 19 is a schematic cross sectional view of a package structure in accordance with some other embodiments of the present disclosure.
Figure 20:
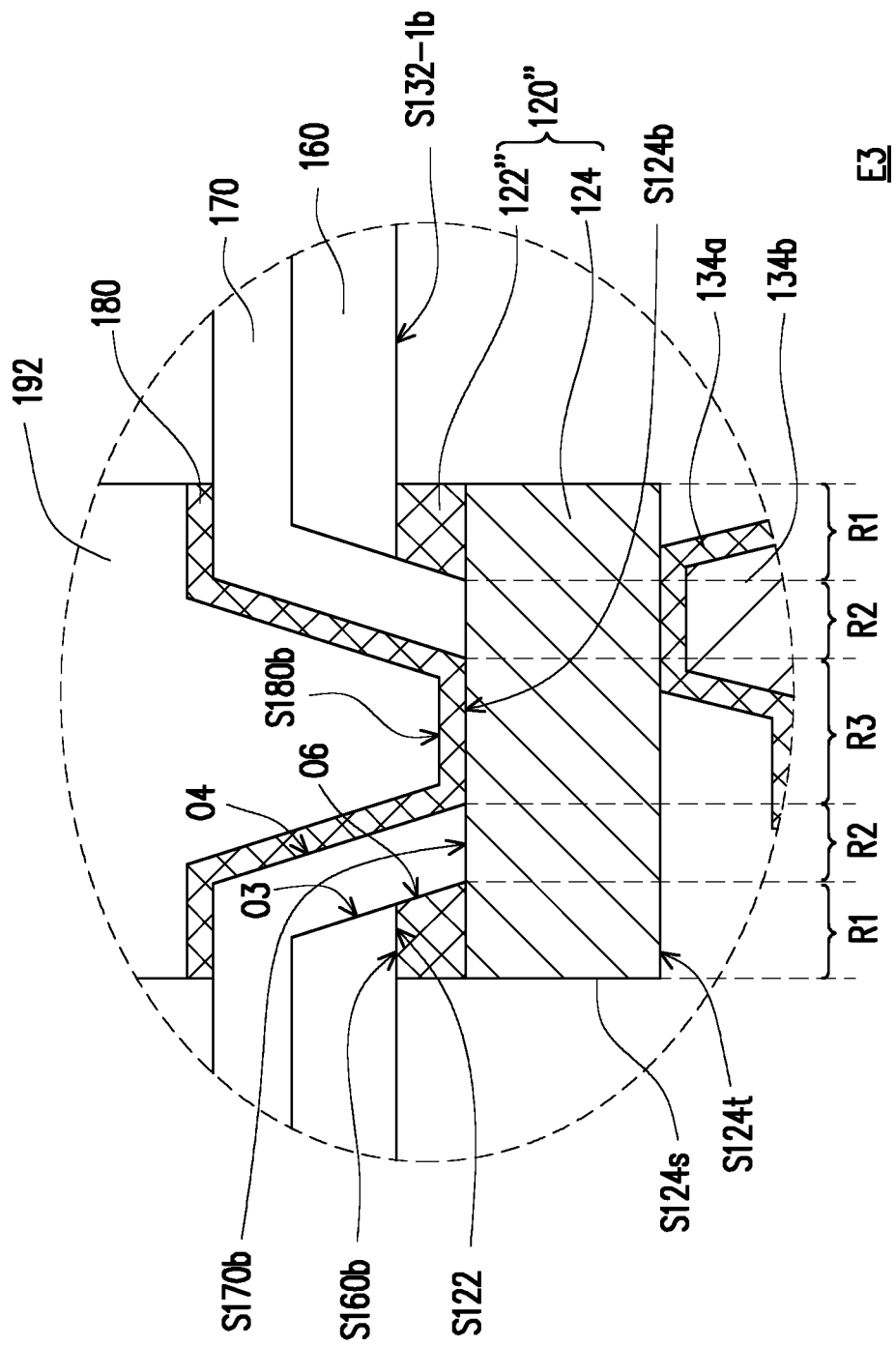
FIG. 20 is an enlarged, schematic cross sectional view of a portion of the package structure depicted in FIG. 19.

FIG. 19 is a schematic cross sectional view of a package structure in accordance with some other embodiments of the present disclosure. FIG. 20 is an enlarged, schematic cross sectional view of a portion of the package structure depicted in FIG. 19, where the portion of the package structure is indicated by a dotted box E3 depicted in FIG. 19. The elements similar to or substantially the same as the elements described previously will use the same reference numbers, and certain details or descriptions (e.g. the materials, formation processes, positioning configurations, etc.) of the same elements would not be repeated herein. Referring to FIG. 14 and FIG. 19 to FIG. 20, a package structure P3 depicted in FIG. 19 and FIG. 20 is similar to the package structure P1 depicted in FIG. 14; the difference is that, in the package structure P3, the connection pads 120 are substituted by connection pads 120" (see FIG. 20).

As illustrated in FIG. 19, in some embodiments, during the formation of the openings O3 formed in the passivation layer 160, portions of the barrier seed patterns 122 of the connection pads 120 are also removed to form the connection pads 120" with openings O6. In some embodiments, the connection pads 120" each have a barrier seed pattern 122" and a conductive pad 124 stacked thereon, where the conductive pad 124 is partially exposed by the openings O6 formed in the barrier seed pattern 122". In other words, the openings O3 formed in the passivation layer 160 each are spatially communicated to a respective one opening O6 formed in the barrier seed pattern 122", so that the conductive pads 124 of the connection pads 120" are exposed by the openings O6 formed in the barrier seed patterns 122" of the connection pads 120" for respectively connecting the barrier seed patterns 180 later-formed.

With such configuration, the openings O4 formed in the dielectric layer 170 are further extended into the openings O6 formed in the barrier seed patterns 122" to expose the conductive pads 124 of the connection pads 120". For example, the barrier seed patterns 180 are respectively connected to the connection pads 120". As shown in FIG. 19 and FIG. 20, each of the barrier seed patterns 180 is physically and electrically connected to a respective one of the connection pads 120" (e.g. sidewalls of the barrier seed patterns 122" within the openings O6 and the surfaces S124b of the conductive pads 124 exposed by the barrier seed patterns 122" exposed by the openings O4 formed in the dielectric layer 170).

As illustrated in FIG. 20, in some embodiments, within the region R1, a portion of each of the barrier seed patterns 122" of the connection pads 120" is in physical contact with the passivation layer 160. In some embodiments, along the stacking direction (e.g. the direction Z), the passivation layer 160 is overlapped with the barrier seed patterns 122" and the conductive pads 124 (e.g. within the region R1). As illustrated in FIG. 20, in some embodiments, within the region R2, a portion (e.g. the surface S124b exposed by opening O6) of each of the conductive pads 124 are in physical contact with the dielectric layer 170. In some embodiments, along the stacking direction (e.g. the direction Z), the dielectric layer 170 is overlapped with the barrier seed patterns 122" (e.g. within the region R1 depicted in FIG. 20) and the conductive pads 124 (e.g. within the regions R1 and R2 depicted in FIG. 20). As illustrated in FIG. 20, in some embodiments, within the region R3, a portion (e.g. the surface S124b exposed by opening O4) of each of the conductive pads 124 is in physical contact with a respective one of the barrier seed patterns 180 overlying thereto. In some embodiments, along the stacking direction (e.g. the direction Z), the barrier seed patterns 180 are respectively overlapped with the barrier seed patterns 122" (e.g. within the region R1 depicted in FIG. 20) and overlapped with the conductive pads 124 (e.g. within the regions R1, R2 and R3 depicted in FIG. 20).

The disclosure is not limited thereto; in alternative embodiments, the conductive elements 194 in the package structure P2 depicted in FIG. 17 and/or the package structure P3 depicted in FIG. 19 may be omitted as well (similar to the conductive terminals 190 shown in the package structure P1' of FIG. 16).

In some alternative embodiments, the package structures P1, P1', P2, and P3 may be further mounted with a circuit substrate, an interposer, an additional package, chips/dies or other electronic devices to form a stacked package structure through the conductive terminals 190 and/or other additional connectors based on the design layout and the demand. For illustration, examples are provided as follows (e.g., a package structure P4 of FIG. 21 and a package structure P5 of FIG. 22 with the application of the package structure P1, and a package structure P6 of FIG. 23 to FIG. 29 with the application of the package structure P1'), but the disclosure is not limited thereto.

Figure 21:
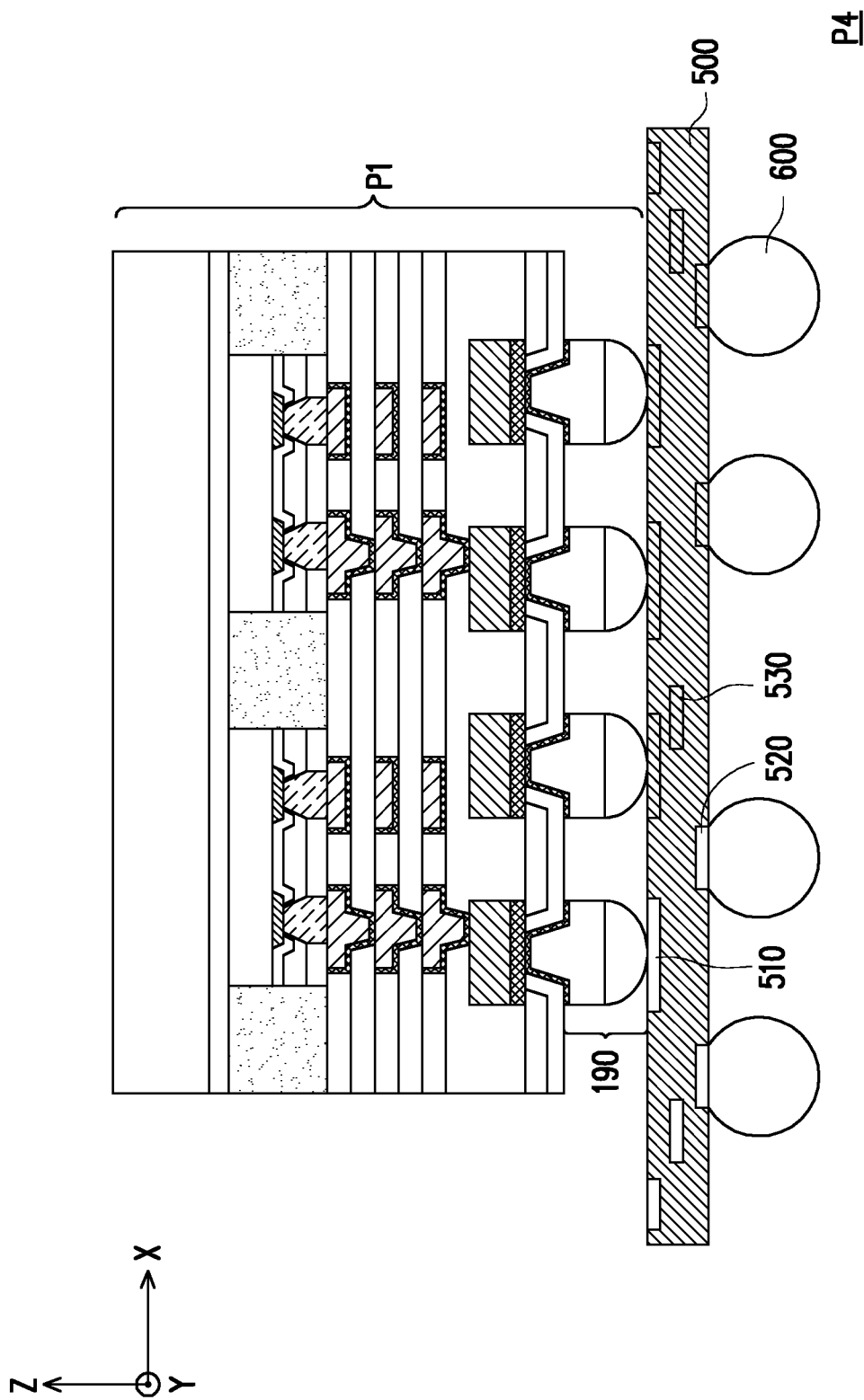
FIG. 21 is a schematic cross sectional view of a package structure in accordance with some other embodiments of the present disclosure.

FIG. 21 is a schematic cross sectional view of a package structure in accordance with some other embodiments of the present disclosure. The elements similar to or substantially the same as the elements described previously will use the same reference numbers, and certain details or descriptions (e.g. the materials, formation processes, positioning configurations, etc.) of the same elements would not be repeated herein.

Referring to FIG. 21, in some embodiments, a substrate 500 is provided. In some embodiments, the substrate 500 includes contact pads 510, contact pads 520, metallization layers 530, and vias (not shown). In some embodiments, the contact pads 510 and the contact pads 520 are respectively distributed on two opposite sides of the substrate 500, and are exposed for electrically connecting with later-formed elements/features. In some embodiments, the metallization layers 530 and the vias are embedded in the substrate 500 and together provide routing function for the substrate 500, where the metallization layers 530 and the vias are electrically connected to the contact pads 510 and the contact pads 520. That is, at least some of the contact pads 510 are electrically connected to some of the contact pads 520 through the metallization layers 530 and the vias. In some embodiments, the contact pads 510 and the contact pads 520 may include metal pads or metal alloy pads. In some embodiments, the materials of the metallization layers 530 and the vias may be substantially the same or similar to the material of the metal material ML, and thus are not repeated herein for simplicity.

In some embodiments, as shown in FIG. 21, the package structure P1 depicted in FIG. 14 is bonded to the substrate 500 through physically connecting the conductive terminals 190 and the contact pads 510 to form the package structure P4 having a stacked structure, where the package structure P1 is physically and electrically connected to the substrate 500. The detail of the package structure P1 is described in FIG. 1 to FIG. 15, and thus are not repeated herein. In some embodiments, the substrate 500 is referred to as a circuit substrate, such as an organic flexible substrate or a printed circuit board. In such embodiments, the conductive terminals 190 are, for example, chip connectors or BGA balls.

In some embodiments, a plurality of conductive terminals 600 are respectively formed on the substrate 500. As shown in FIG. 21, for example, the conductive terminals 600 are connected to the contact pads 520 of the substrate 500. In other words, the conductive terminals 600 are electrically connected to the substrate 500 through the contact pads 520. Through the contact pads 510 and the contact pads 520, some of the conductive terminals 600 are electrically connected to the package structure P1 (e.g. the semiconductor dies 140 included therein). In some embodiments, the conductive terminals 600 are, for example, solder balls or BGA balls. In some embodiments, the package structure P1 is bonded to the substrate 500 through physically connecting the conductive terminals 190 and the contact pads 510 of the substrate 500 by flip chip bonding.

Figure 22:
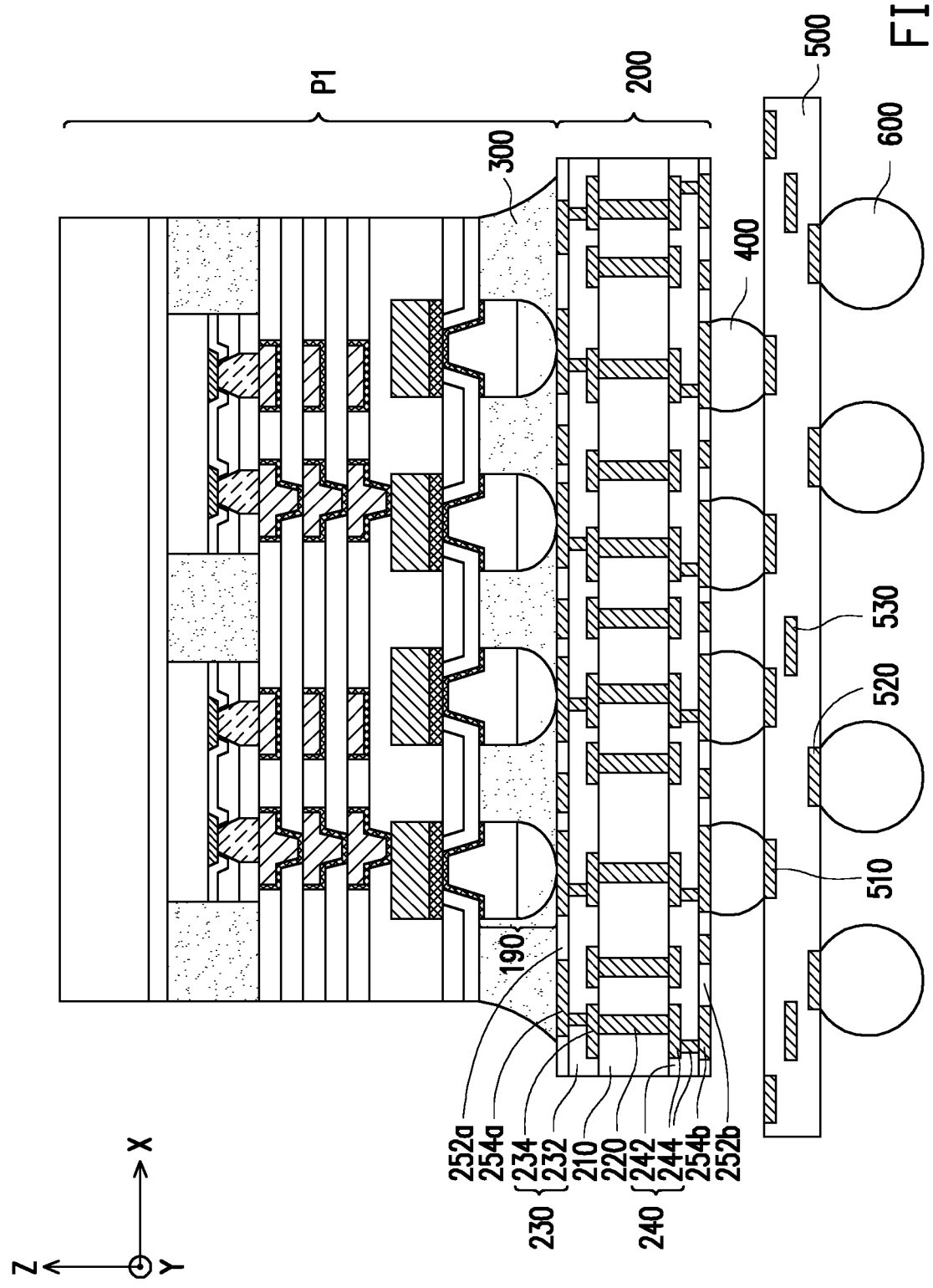
FIG. 22 is a schematic cross sectional view of a package structure in accordance with some other embodiments of the present disclosure.

FIG. 22 is a schematic cross sectional view of a package structure in accordance with some other embodiments of the present disclosure. The elements similar to or substantially the same as the elements described previously will use the same reference numbers, and certain details or descriptions (e.g. the materials, formation processes, positioning configurations, etc.) of the same elements would not be repeated herein.

Referring to FIG. 22, in some embodiments, a circuit element 200 is provided. In some embodiments, the circuit element 200 includes a core portion 210, a plurality of vias 220, a redistribution circuit structure 230, a redistribution circuit structure 240, a plurality of bonding pads 254a, a plurality of bonding pads 254b, a solder mask layer 252a, and a solder mask layer 252b.

In some embodiments, the core portion 210 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 220 is through silicon vias penetrating the core portions 210. The circuit element 200 is referred to as an interposer (see FIG. 22), in the disclosure.

In some embodiments, the redistribution circuit structure 230 and the redistribution circuit structure 240 respectively disposed on two opposite sides of the core portion 210, as shown in FIG. 22. In some embodiments, the redistribution circuit structure 230 and/or the redistribution circuit structure 240 are electrically connected to the vias 220 penetrating the core portion 210. As shown in FIG. 22, the core portion 210 embedded with the vias 220 is located between the redistribution circuit structure 230 and the redistribution circuit structure 240, in some embodiments. Through the vias 220, the redistribution circuit structure 230 and the redistribution circuit structure 240 are electrically connected to each other.

In some embodiments, the redistribution circuit structure 230 includes sequentially forming one or more dielectric layers 232 and one or more metallization layers 234 in alternation, where one metallization layer 234 is sandwiched between two dielectric layers 232. As shown in FIG. 22, portions of a top surface of a topmost layer of the metallization layers 234 are respectively exposed by openings formed in a topmost layer of the dielectric layers 232 for connecting with other conductive features, and portions of a bottom surface of a bottommost layer of the metallization layers 234 are respectively exposed by openings formed in a bottommost layer of the dielectric layers 232 for connecting with the vias 220. The numbers of the metallization layers and the dielectric layers included in the redistribution circuit structure 230 are not limited thereto, and may be designated and selected based on the demand.

In some embodiments, the redistribution circuit structure 240 includes sequentially forming one or more dielectric layers 242 and one or more metallization layers 244 in alternation, where one metallization layer 244 is sandwiched between two dielectric layers 242. As shown in FIG. 22, portions of a top surface of a topmost layer of the metallization layers 244 are respectively exposed by openings formed in a topmost layer of the dielectric layers 242 for connecting with the vias 220, and portions of a bottom surface of a bottommost layer of the metallization layers 244 are respectively exposed by openings formed in a bottommost layer of the dielectric layers 242 for connecting with other conductive features. The numbers of the metallization layers and the dielectric layers included in the redistribution circuit structure 240 are not limited thereto, and may be designated and selected based on the demand.

In certain embodiments, the materials of the dielectric layers 232 and the dielectric layers 242 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 232 and the dielectric layers 242 are formed by suitable fabrication techniques such as spin-on coating, CVD, PECVD, or the like. The disclosure is not limited thereto. In one embodiment, the materials of the dielectric layers 232 and the dielectric layers 242 may be the same. In an alternative embodiment, the materials of the dielectric layers 232 and the dielectric layers 242 may be different.

In certain embodiments, the material of the metallization layers 234 and the metallization layers 244 may be made of conductive materials formed by electroplating or deposition, such as aluminum, titanium, copper, nickel, tungsten, and/or alloys thereof, which may be patterned using a photolithography and etching process. In some embodiments, the metallization layers 234 and the metallization layers 244 may be patterned copper layers or other suitable patterned metal layers. In one embodiment, the materials of the metallization layers 234 and the metallization layers 244 may be the same. In an alternative embodiment, the materials of the metallization layers 234 and the metallization layers 244 may be different.

In some embodiments, the bonding pads 254a are disposed on a surface of the redistribution circuit structure 230 and physically connected to the portions of the top surface of the topmost layer of the metallization layers 234 exposed by the openings formed in the topmost layer of the dielectric layers 232, where the bonding pads 254a are physically separated from each other through the solder mask layer 252a formed on the surface of the redistribution circuit structure 230 with the bonding pads 254a disposed thereon. Through the redistribution circuit structure 230, the bonding pads 254a are electrically connected to the vias 220 embedded in the core portion 210.

In some embodiments, the bonding pads 254b are disposed on a surface of the redistribution circuit structure 240 and physically connected to the portions of the bottom surface of the bottommost layer of the metallization layers 244 exposed by the openings formed in the bottommost layer of the dielectric layers 242, where the bonding pads 254b are physically separated from each other through the solder mask layer 252b formed on the surface of the redistribution circuit structure 240 with the bonding pads 254b disposed thereon. Through the redistribution circuit structure 240, the bonding pads 254b are electrically connected to the vias 220 embedded in the core portion 210.

As shown in FIG. 22, for example, the bonding pads 254a are electrically connected to the redistribution circuit structure 230 and the bonding pads 254b are electrically connected to the redistribution circuit structure 240. In some embodiments, the bonding pads 254a and the bonding pads 254b may include under bump metallurgies (UBMs), however the disclosure is not limited thereto. As shown in FIG. 22, the bonding pads 254a and the bonding pads 254b are electrically connected to each other though the vias 220, the redistribution circuit structure 230, and redistribution circuit structure 240, for example.

In an alternative embodiment, the redistribution circuit structure 230 and the redistribution circuit structure 240, one or both, may be omitted from the circuit element 200, the disclosure is not limited thereto. That is, for example, the circuit element 200 may include a core portion 210, a plurality of vias 220, a plurality of bonding pads 254a, a plurality of bonding pads 254b, a solder mask layer 252a, and a solder mask layer 252b, where the bonding pads 254a and the bonding pads 254b are electrically connected to each other though the vias 220.

In some embodiments, a plurality of conductive terminals 400 are respectively formed on the bonding pads 254b. As shown in FIG. 22, for example, the conductive terminals 400 are physically connected to the bonding pads 254b. In other words, the conductive terminals 400 are electrically connected to the circuit element 200 through the bonding pads 254b. Through the bonding pads 254b, some of the conductive terminals 400 are electrically connected to some of the bonding pads 254a. In some embodiments, the conductive terminals 400 are, for example, chip connectors or BGA balls.

Continued on FIG. 22, in some embodiments, the package structure P1 depicted in FIG. 14 is provided and bonded to the circuit element 200, and the circuit element 200 is bonded to the substrate 500 to form the package structure P5 having a stacked structure. The detail of the package structure P1 is described in FIG. 1 to FIG. 15, and the detail of the substrate 500 is described in FIG. 21, and thus are not repeated herein. In some embodiments, the package structure P1 is physically connected to the circuit element 200 through connecting the conductive terminals 190 and the bonding pads 254a of the circuit element 200, and the circuit element 200 is physically connected to the substrate 500 through connecting the conductive terminals 400 and the contact pads 510 of the substrate 500. In other words, the package structure P1 is electrically connected to the circuit element 200 through the conductive terminals 190 and the bonding pads 254a, the circuit element 200 is electrically connected to the substrate 500 through the conductive terminals 400 and the contact pads 510, so that the package structure P1 is electrically connected to the substrate 500 through the conductive terminals 190, the bonding pads 254a, the conductive terminals 400 and the contact pads 510. In such embodiments, the conductive terminals 190 are, for example, micro-bumps while the conductive terminals 400 are chip connectors and the conductive terminals 600 are solder balls or BGA balls. In certain embodiments, the package structure P5 depicted in FIG. 22 may be formed by chip on wafer on substrate (CoWoS) packaging processes.

In some embodiments, an underfill 300 is optimally formed on the circuit element 200. As shown in FIG. 22, for example, the underfill 300 at least fills the gaps between the package structure P1 and the circuit element 200, and wraps sidewalls of the conductive terminals 190. In some alternative embodiments, a sidewall of the package structure P1 may further covered by the underfill 300, the disclosure is not limited thereto. The underfill 300 may be any acceptable material, such as a polymer, epoxy, molding underfill, or the like, for example. In one embodiment, the underfill 300 may be formed by underfill dispensing or any other suitable method. Owing to the underfill 300, the bonding strength between the package structure P1 and the circuit element 200 are enhanced, thereby improving the reliability of the package structure P5.

FIG. 23 to FIG. 29 are schematic cross sectional views of various stages in a manufacturing method of a package structure in accordance with some embodiments of the present disclosure. The elements similar to or substantially the same as the elements described previously will use the same reference numbers, and certain details or descriptions (e.g. the materials, formation processes, positioning configurations, etc.) of the same elements would not be repeated herein.

Figure 23:
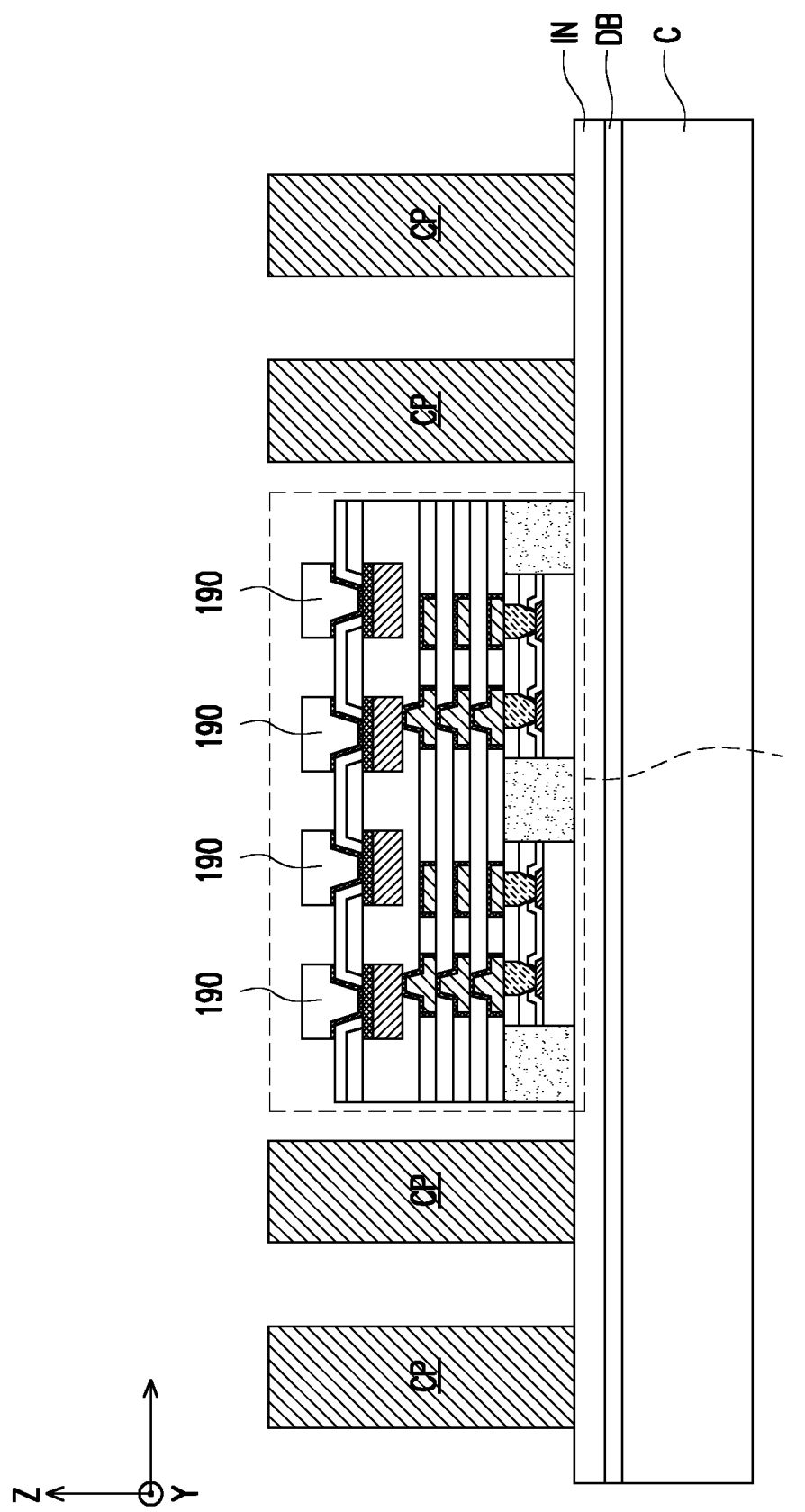
FIG. 23 to FIG. 29 are schematic cross sectional views of various stages in a manufacturing method of a package structure in accordance with some embodiments of the present disclosure.

Referring to FIG. 23, in some embodiments, a carrier C having a de-bonding layer DB and an insulating layer IN formed thereon is provided. In some embodiments, the de-bonding layer DB is between the carrier C and the insulating layer IN. In some embodiments, the carrier C is a glass substrate, the de-bonding layer DB is a LTHC release layer formed on the glass substrate, and the insulating layer IN is a PBO layer formed on the de-bonding layer DB, for example. It is noted that the formation of the insulating layer IN is optional in some alternative embodiments. It may also be noted that materials for the carrier C, the de-bonding layer DB, and the insulating layer IN are not limited to what are disclosed herein according to the disclosure.

In some embodiments, after the carrier C having the de-bonding layer DB and the insulating layer IN formed thereon is provided, a plurality of conductive pillars CP are formed on the insulating layer IN. In some embodiments, the conductive pillars CP are formed over the carrier C (e.g., directly on the insulating layer IN) by photolithography, plating, and photoresist stripping process. In some alternative embodiments, the conductive pillars CP are pre-fabricated through other processes and are mounted over the carrier C. For example, the conductive pillars CP include copper posts or other metallic posts.

Continued on FIG. 23, in some embodiments, one of the package structure P1' depicted in FIG. 16 may be picked-up and placed on the insulating layer IN carried by the carrier C. In some embodiments, the package structure P1' is attached or adhered on the insulating layer IN through a die attach film, an adhesion paste or the like. In some embodiments, the package structure P1' may have a thickness less than a height of the conductive pillars CP, as shown in FIG. 23. However, the disclosure is not limited thereto. In an alternative embodiment, the thickness of the package structure P1' may be greater than or substantially equal to the height of the conductive pillars CP. As shown in FIG. 23, the package structure P1' may be picked-up and placed on the insulating layer IN after the formation of the conductive pillars CP. However, the disclosure is not limited thereto. In an alternative embodiment, the package structure P1' may be picked-up and placed on the insulating layer IN before the formation of the conductive pillars CP.

Figure 24:
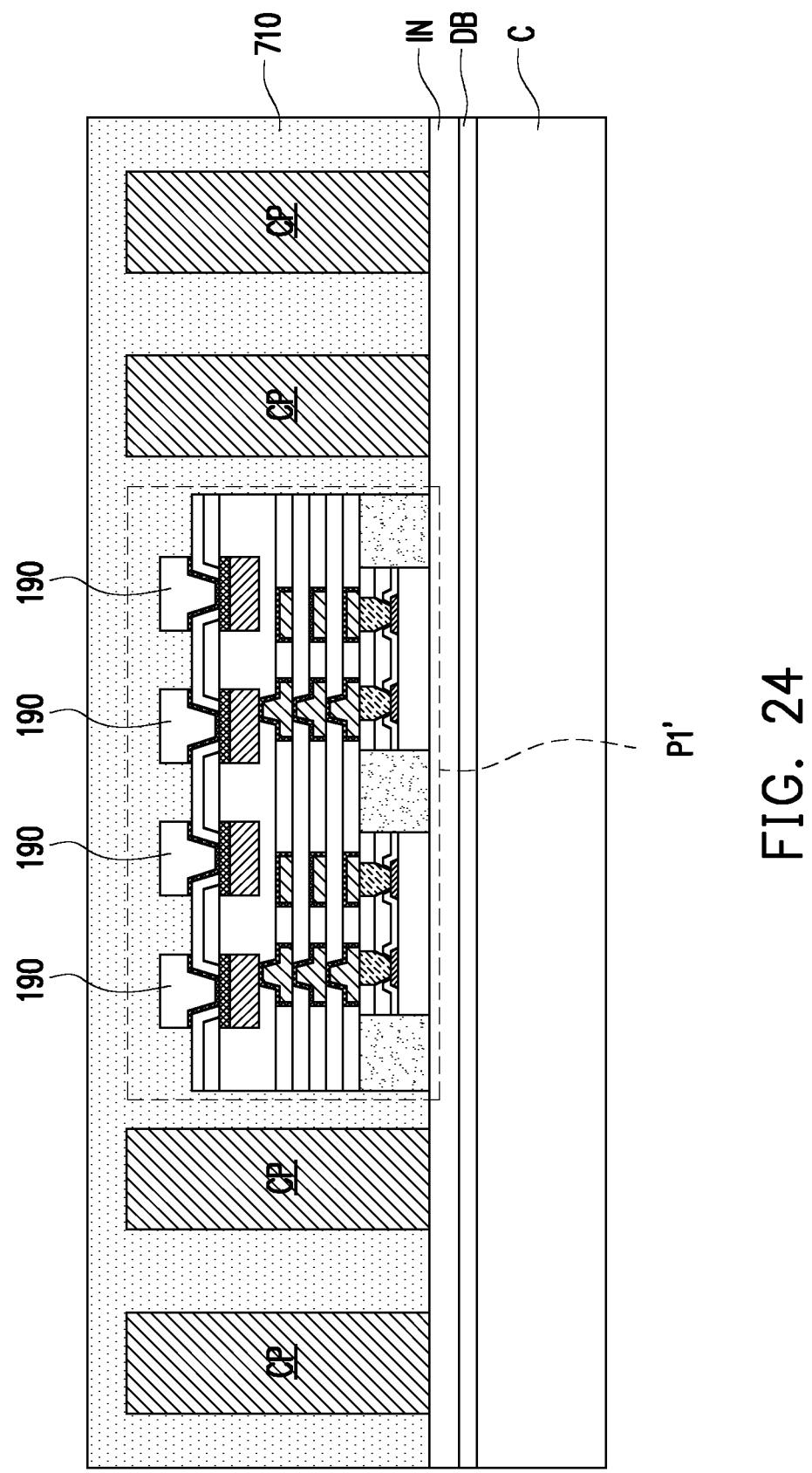

Referring to FIG. 24, an insulating encapsulation 710 is formed over the carrier C (e.g., on the insulating layer IN) to encapsulate the package structure P1' and the conductive pillars CP. In other words, the package structure P1' and the conductive pillars CP are covered by and embedded in the insulating encapsulation 710. In some embodiments, the insulating encapsulation 710 is a molding compound formed by a molding process, and the material of the insulating encapsulation 710 may include epoxy or other suitable resins. For example, the insulating encapsulation 710 may be epoxy resin containing chemical filler. As shown in FIG. 24, the package structure P1' and the conductive pillars CP are not accessibly revealed by the insulating encapsulation 710.

Figure 25:
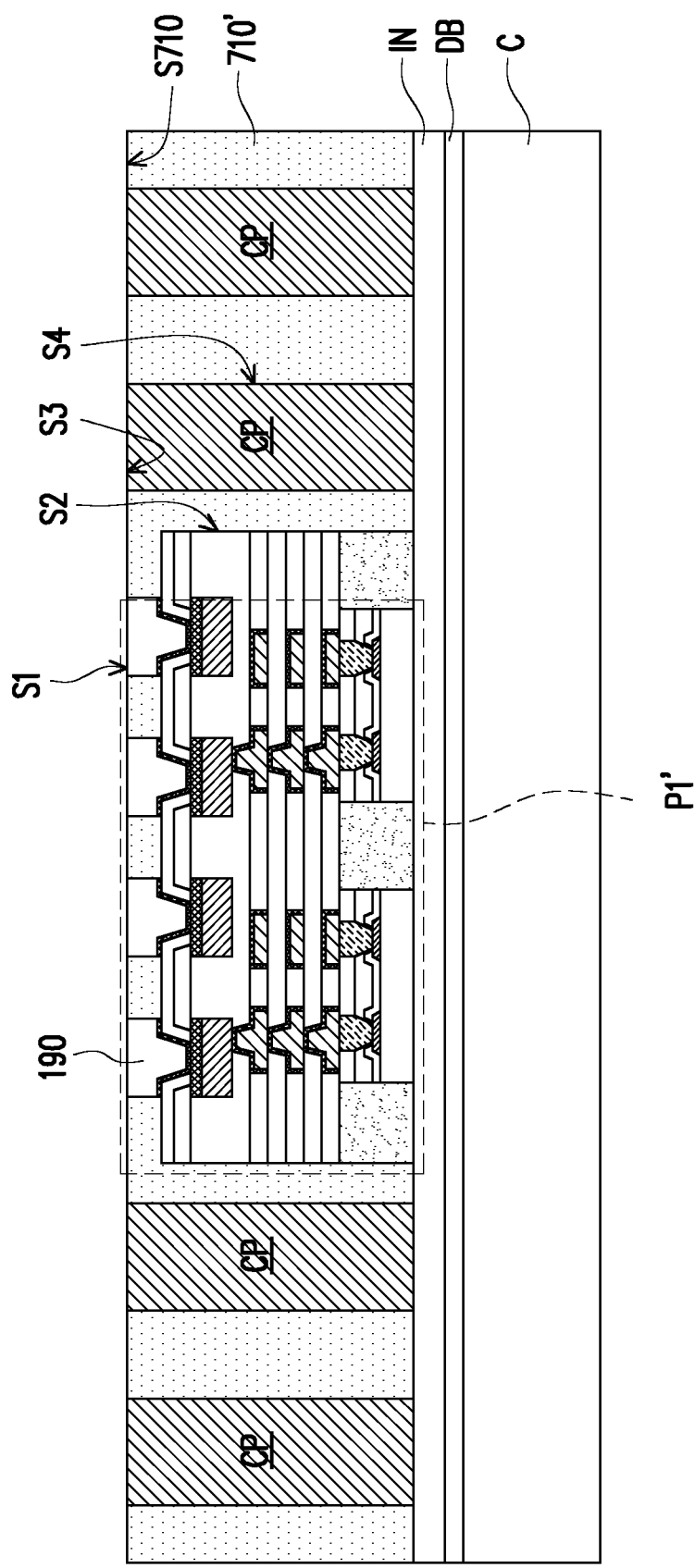

Referring to FIG. 24 and FIG. 25, in some embodiments, the insulating encapsulation 710, the conductive pillars CP and the package structure P1' are planarized until a top surface S1 of the package structure P1' (e.g., top surfaces of the conductive terminals 190) and top surfaces S3 of the conductive pillars CP are exposed. After the insulating encapsulation 710 is planarized, a planarized insulating encapsulation 710' is formed over the carrier C (e.g., on the insulating layer IN). During the planarized process of the insulating encapsulation 710, the conductive terminals 190 of the package structure P1' are also planarized. In some embodiments, during the planarized process of the insulating encapsulation 710 and the conductive terminals 190 of the package structure P1', portions of the conductive pillars CP are planarized also. The planarized insulating encapsulation 710' may be formed by mechanical grinding or CMP, for example. After the planarizing process, a cleaning step may be optionally performed, for example to clean and remove the residue generated from the planarizing step. However, the disclosure is not limited thereto, and the planarizing step may be performed through any other suitable method.

In some embodiments, as shown in FIG. 25, the planarized insulating encapsulation 710' physically contacts a sidewall S2 of the package structure P1' and sidewalls S4 of the conductive pillars CP. In other words, the package structure P1' and the conductive pillars CP are mostly embedded in the planarized insulating encapsulation 710' with only the top surface Si of the package structure P1' and top surface S3 of the conductive pillars CP being accessibly exposed. In certain embodiments, the top surface S1 of the package structure P1' and top surface S3 of the conductive pillars CP are substantially leveled with a top surface S710 of the planarized insulating encapsulation 710'. In other words, the top surface S1 of the package structure P1' and the top surface S3 of the conductive pillars CP are substantially coplanar with the top surface S710 of the planarized insulating encapsulation 710'.

Figure 26:
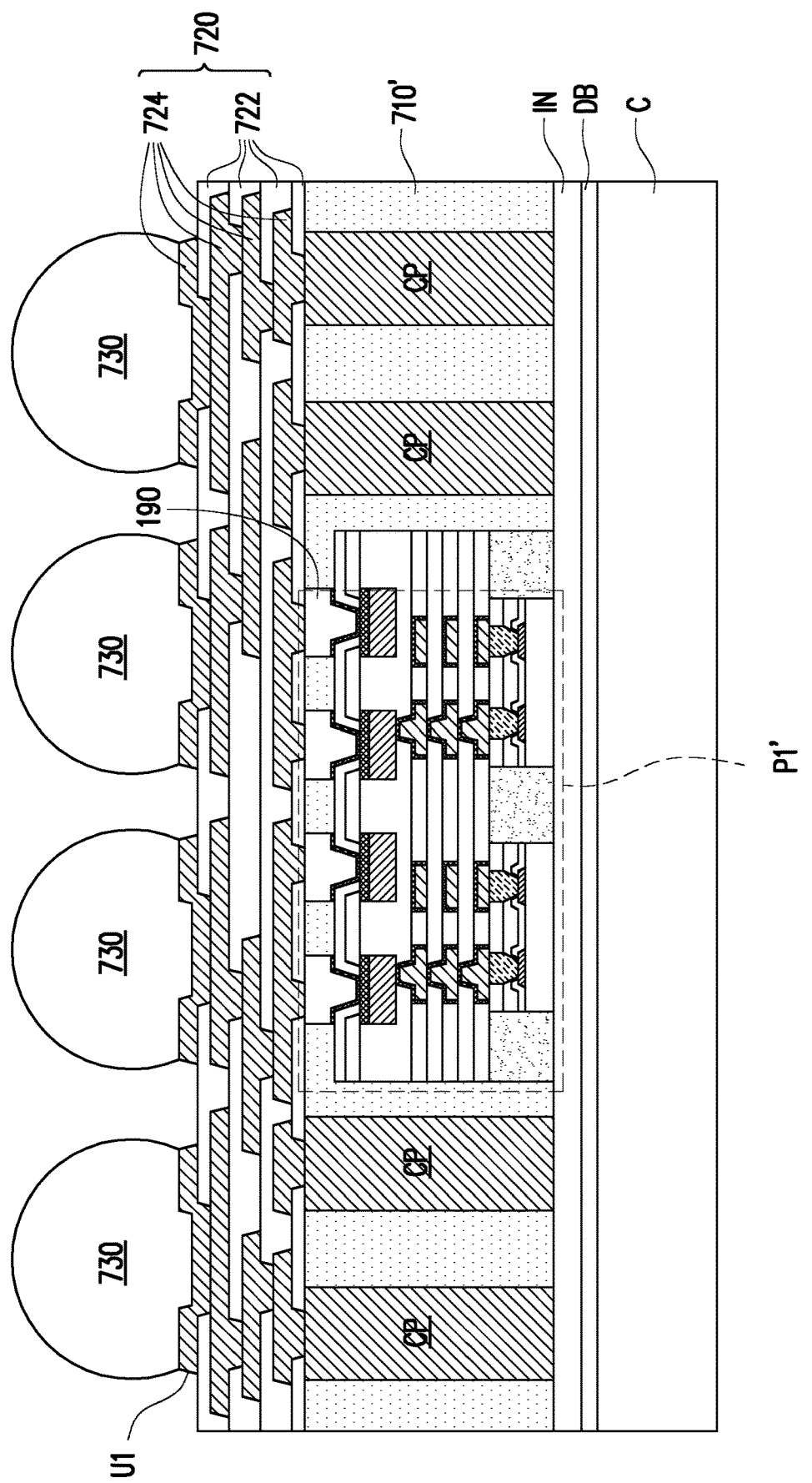

Referring to FIG. 26, in some embodiments, after the planarized insulating encapsulation 710' is formed, a redistribution circuit structure 720 is formed on the planarized insulating encapsulation 710'. In some embodiments, the redistribution circuit structure 720 is formed on the top surface S1 of the package structure P1', the top surface S3 of the conductive pillars CP and the top surface S710 of the planarized insulating encapsulation 710'. In certain embodiments, the redistribution circuit structure 720 is fabricated to electrically connect with one or more connectors underneath. Here, the afore-said connectors may be the conductive terminals 190 of the package structure P1' and the conductive pillars CP embedded in the planarized insulating encapsulation 710'. In other words, the redistribution circuit structure 720 is electrically connected to the conductive terminals 190 of the package structure P1' and the conductive pillars CP.

Continued on FIG. 26, in some embodiments, the redistribution circuit structure 720 includes a plurality of inter-dielectric layers 722 and a plurality of redistribution conductive layers 724 stacked alternately, and the redistribution conductive layers 724 are electrically connected to the conductive terminals 190 of the package structure P1' and the conductive pillars CP embedded in the planarized insulating encapsulation 710'. As shown in FIG. 26, in some embodiments, the top surface Si of the package structure P1' and the top surface S3 of the conductive pillars CP are in contact with the redistribution circuit structure 720. In such embodiments, the top surface Si of the package structure P1' and the top surface S3 of the conductive pillars CP are in physical contact with the bottommost one of the redistribution conductive layers 724. In some embodiments, the top surface S1 of the package structure P1' and the top surface S3 of the conductive pillars CP are partially covered by the bottommost inter-dielectric layer 222. In certain embodiments, the topmost redistribution conductive layer 224 may include a plurality of pads. In such embodiments, the above-mentioned pads may include a plurality of under-ball metallurgy (UBM) patterns U1 for ball mount and/or a plurality of connection pads (not shown) for mounting of additional semiconductor element(s) (such as a passive component or active component). The number of the under-ball metallurgy patterns U1 is not limited according to the disclosure. The numbers of the inter-dielectric layers 722 and of the redistribution conductive layers 724 are not limited according to the disclosure.

As shown in FIG. 26, in some embodiments, after the redistribution circuit structure 720 is formed, a plurality of conductive terminals 730 are placed on the under-ball metallurgy patterns U1, respectively. In some embodiments, the conductive terminals 730 may be placed on the under-ball metallurgy patterns U1 through ball placement process. In some embodiments, through the redistribution circuit structure 720 and the conductive pillars CP, some of the conductive terminals 730 are electrically connected to the package structure P1'. In certain embodiments, some of the conductive terminals 730 may be electrically floated or grounded, the disclosure is not limited thereto.

In some alternative embodiments, the additional semiconductor element(s) may be provided and mounted on the under-ball metallurgy patterns U1 through soldering process. In some embodiments, through the redistribution circuit structure 720 and the conductive pillars CP, some of the conductive terminals 730 are electrically connected to the additional semiconductor element(s).

Figure 27:
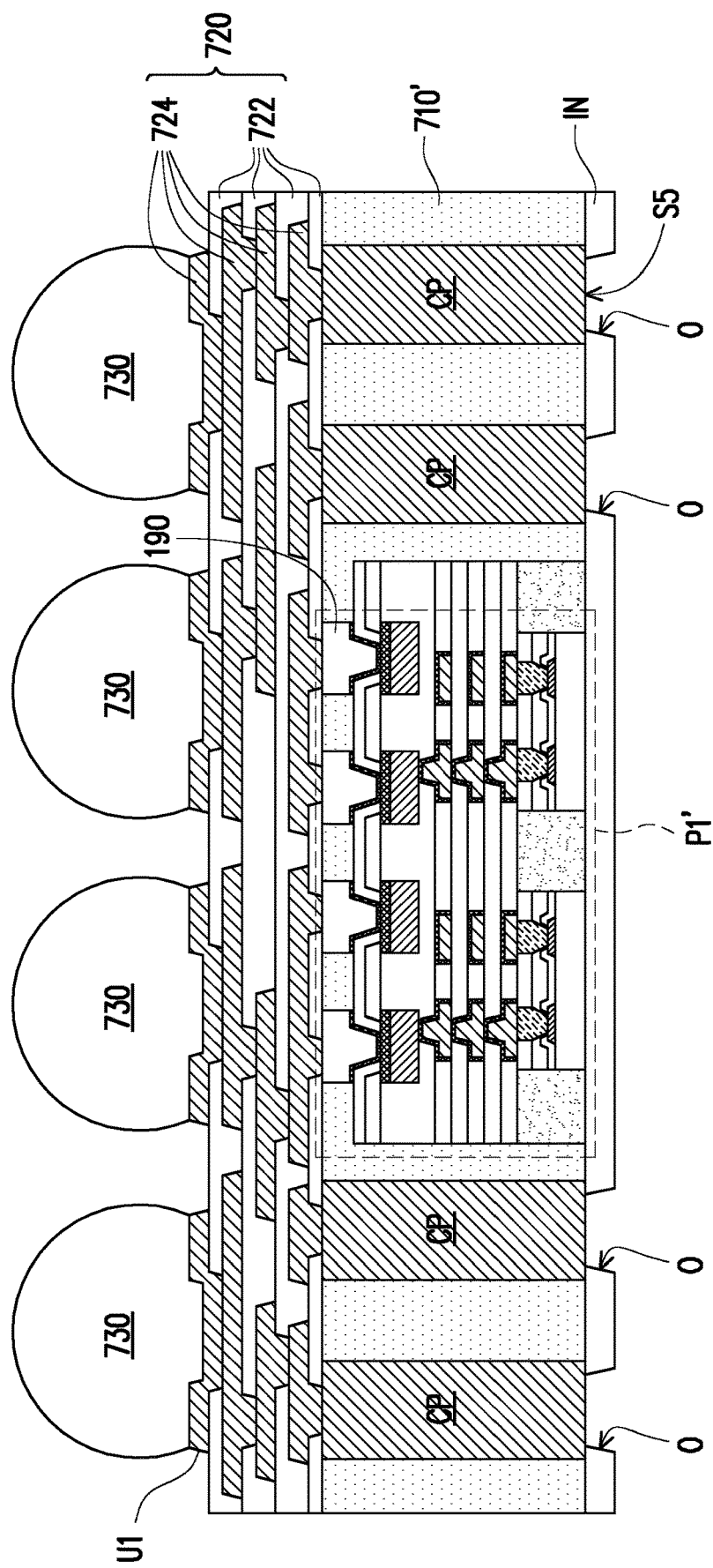

Referring to FIG. 26 and FIG. 27, in some embodiments, after the redistribution circuit structure 720 and the conductive terminals 730 are formed, the insulating layer IN, the planarized insulating encapsulation 710' and the package structure P1' are debonded from the de-bonding layer DB carried by the carrier C, such that the insulating layer IN is separated from the carrier C. In embodiments where the de-bonding layer DB is the LTHC release layer, an UV laser irradiation may be utilized to facilitate peeling of the insulating layer IN from the carrier C.

As shown in FIG. 27, in some embodiments, the insulating layer IN may be further patterned, such that a plurality of contact openings O is formed in the insulating layer IN to expose bottom surfaces S5 of the conductive pillars CP. The number of the contact openings O may correspond to the number of the conductive pillars CP, the disclosure is not limited thereto. In some embodiments, the contact openings O in the insulating layer IN are formed by laser drilling process or other suitable processes.

Figure 28:
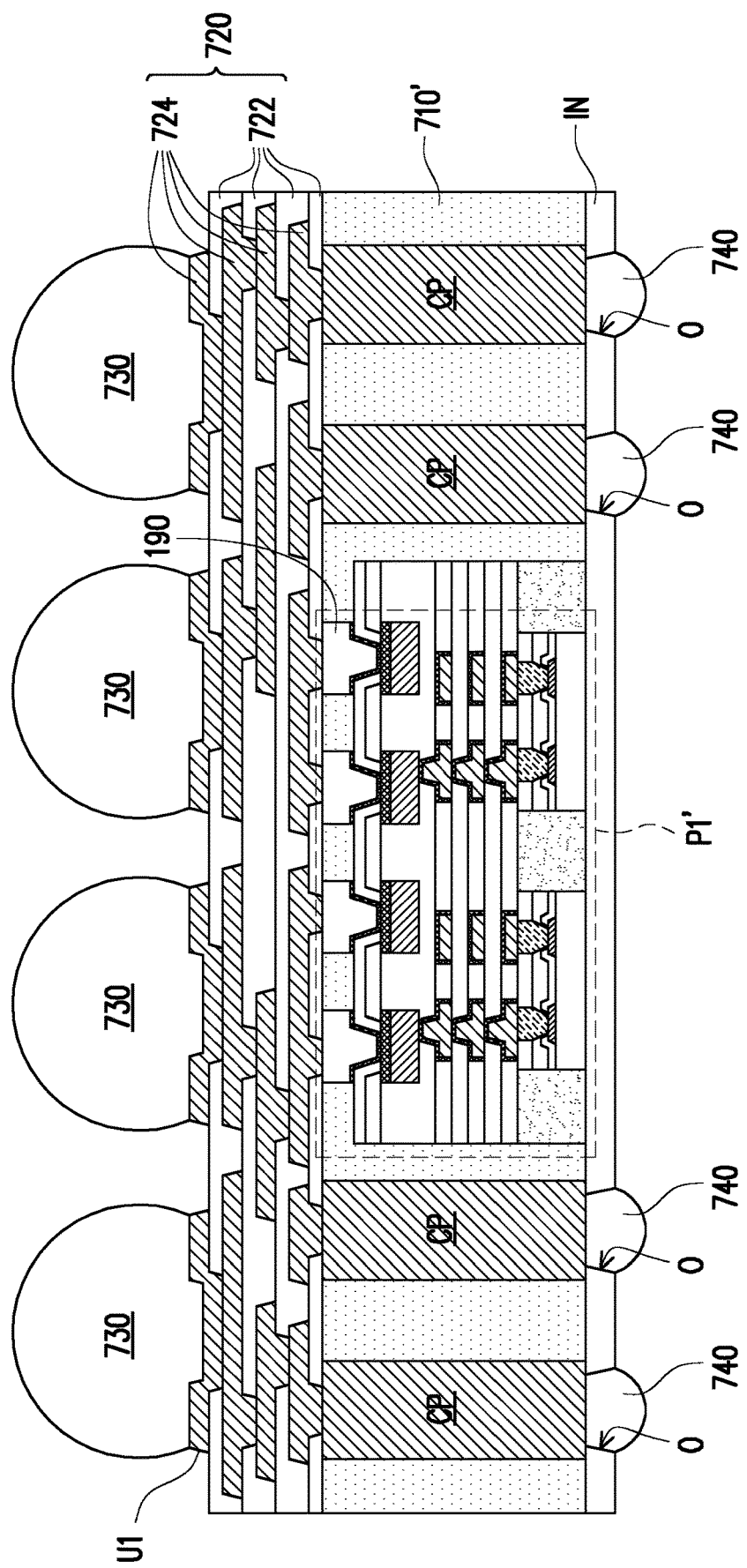

Referring to FIG. 28, in some embodiments, after the contact openings O are formed in the insulating layer IN, a plurality of conductive balls 740 is respectively formed on the bottom surfaces S5 of the conductive pillars CP that are exposed by the contact openings O. And, the conductive balls 740 may be, for example, reflowed to bond with the bottom surfaces S5 of the conductive pillars CP. As shown in FIG. 28, after the conductive terminals 730 and the conductive balls 740 are formed, the formation of an integrated fan-out (InFO) package of the package structure P1' having dual-side terminals is accomplished. In some embodiments, through the redistribution circuit structure 720 and the conductive pillars CP, some of the conductive balls 740 are electrically connected to the package structure P1'. In some embodiments, through the redistribution circuit structure 720 and the conductive pillars CP, some of the conductive balls 740 are electrically connected to the conductive terminals 730. In some embodiments, through the redistribution circuit structure 720 and the conductive pillars CP, some of the conductive balls 740 are electrically connected to the additional semiconductor element(s). In certain embodiments, some of the conductive balls 740 may be electrically floated or grounded, the disclosure is not limited thereto.

Figure 29:
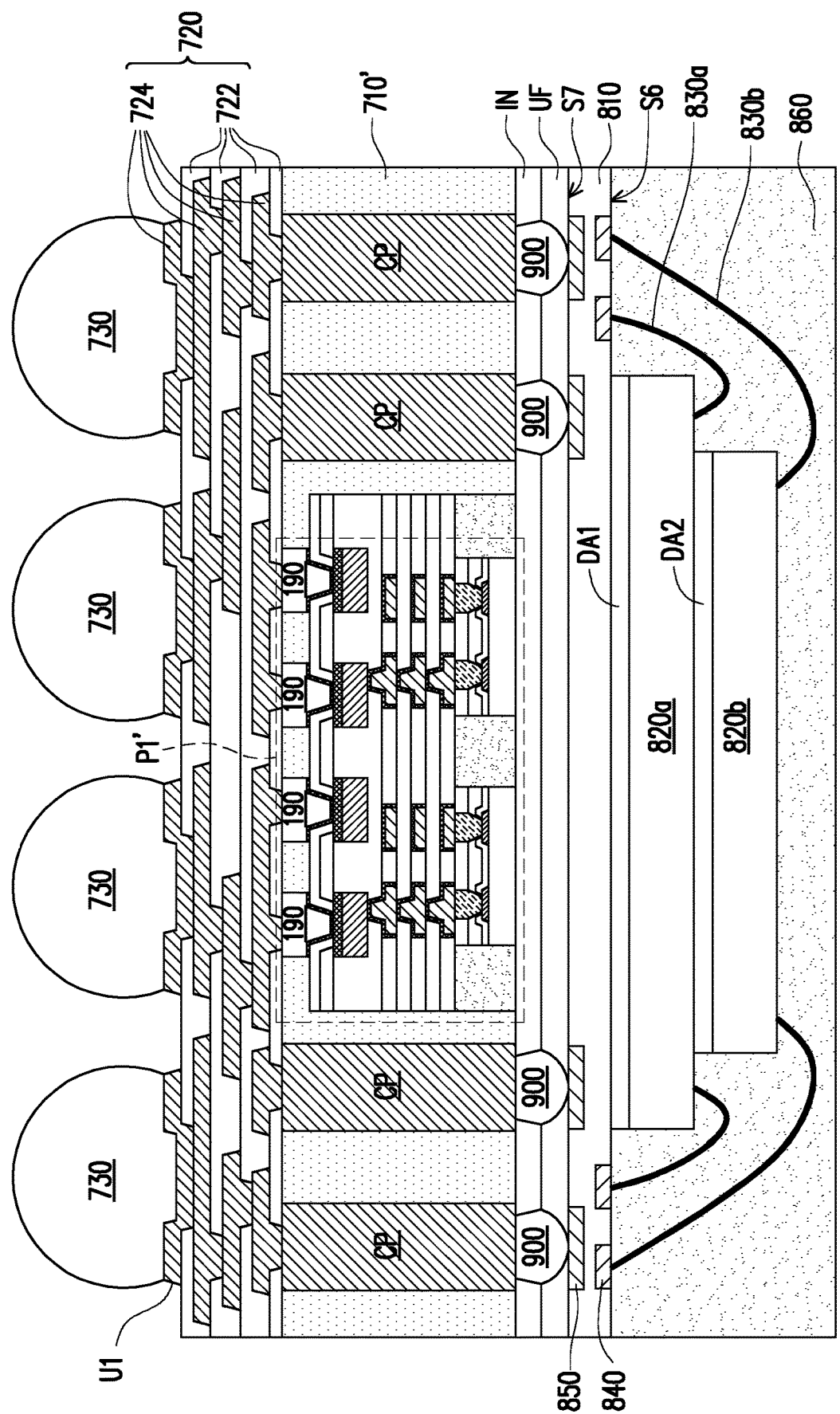

Referring to FIG. 29, in some embodiments, a package 800 is provided and bonded to the structure depicted in FIG. 28 to form the package structure P6 having a stacked structure. In some embodiments, the package 800 has a substrate 810, semiconductor dies 820a and 820b, bonding wires 830a and 830b, conductive pads 840, conductive pads 850, an insulating encapsulation 860, and the joining solder balls (not shown). As shown in FIG. 29, for example, the semiconductor die 820a with a connecting film DA1 disposed thereon and the semiconductor die 820b with a connecting film DA2 are provided and are disposed on the substrate 810. In some embodiments, the connecting film DA1 is located between the semiconductor die 220a and the substrate 810, and the connecting film DA2 is located between the semiconductor die 220a and the semiconductor die 220b. In some embodiments, due to the connecting films DA1 and DA2 respectively provided between the semiconductor die 820 and the substrate 810 and between the semiconductor dies 820a and 820b, the semiconductor dies 820a, 820b are stably adhered to the substrate 810. In some embodiments, the connecting films DA1, DA2 may be, for example, a die attach film, a layer made of adhesives or epoxy resin, or the like.

For example, the semiconductor dies 820a and 820b are mounted on one surface (e.g. a surface S6) of the substrate 810. In some embodiments, the semiconductor dies 820a and 820b may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), front-end chips (e.g., analog front-end (AFE) chips, the like, or a combination thereof). The semiconductor dies 820a and 820b are DRAM chips, as shown in FIG. 29, for example. In one embodiment, the semiconductor dies 820a and 820b may be the same. However, the disclosure is not limited thereto; in an alternative embodiment, the semiconductor dies 820a and 820b may be different from each other.

In some embodiments, the bonding wires 830a and 830b are respectively used to provide electrical connections between the semiconductor dies 820a, 820b and some of the conductive pads 840 (such as bonding pads) located on the surface S6 of the substrate 810. Owing to the bonding wires 830a and 830b, the semiconductor dies 820a and 820b are electrically connected to the substrate 810.

In some embodiments, the insulating encapsulation 860 is formed on the surface S6 of the substrate 810 to encapsulate the semiconductor dies 820a, 820b, the bonding wires 830a, 830b, and the conductive pads 840 to protect these components. In some embodiments, the materials of the insulating encapsulation 860 is the same as the insulating encapsulation 710/the planarized insulating encapsulation 710', and thus is not repeated herein. In one embodiment, the materials of the insulating encapsulation 860 is different from the insulating encapsulation 710/the planarized insulating encapsulation 710', the disclosure is not limited thereto.

In some embodiments, interconnects (not shown) or through insulator vias (not shown) embedded in the substrate 810 may be used to provide electrical connection between the conductive pads 840 and the conductive pads 850 (such as bonding pads) that are located on another surface (e.g. a surface S7 opposite to the surface S6) of the substrate 810. In certain embodiments, some of the conductive pads 850 are electrically connected to the semiconductor dies 820a and 820b through these through insulator vias or interconnects (not shown) in addition to some of the conductive pads 840 and the bonding wires 830a, 830b.

In some embodiments, the conductive pads 850 of the package 800 are electrically connected to the conductive pillars CP through a plurality of joints 900 that are sandwiched therebetween, where the joints 900 are formed by the joining solder balls (not shown) formed on the conductive pads 850 of the package 800 and the conductive balls 740 of the structure depicted in FIG. 28. For example, the joints 900 are physically connected to the conductive pillars CP of the structure depicted in FIG. 28 and the conductive pads 850 of the package 800, as shown in FIG. 29. In some embodiments, the redistribution circuit structure 720 is electrically connected to the substrate 810 of the package 800 through the conductive pillars CP, the joints 900, and the conductive pads 850. In some embodiments, some of the conductive terminals 730 are electrically connected to the substrate 810 of the package 800 through the redistribution circuit structure 720, the conductive pillars CP, the joints 900, and the conductive pads 850. In some embodiments, the package structure P1' is electrically connected to the substrate 810 of the package 800 through the redistribution circuit structure 720, the conductive pillars CP, the joints 900, and the conductive pads 850. That is, the package structure P1' and the package 800 are electrically connected and physically connected through the joints 900 sandwiched therebetween, where the semiconductor dies 820a, 820b are electrically connected to the package structure P1'. In other words, the semiconductor dies 820a, 820b are electrically communicated to the semiconductor dies 140 of the package structure P1'. In the disclosure, the joints 900 may be referred to as solder joints for connecting to two packages (e.g. the structure depicted in FIG. 28 having the package structure P1' packed therein and the package 800 depicted in FIG. 29).

In addition, as shown in FIG. 29, an underfill UF fills the gaps between the joints 900 and encapsulates the joints 900, for example. In one embodiment, the underfill UF may be formed by underfill dispensing or any other suitable method. In some embodiments, a material of the underfill UF may be the same or different from a material of the insulating encapsulation 710/the planarized insulating encapsulation 710', a material of the insulating encapsulation 860, and/or the material of the underfill 300 described in FIG. 22, the disclosure is not limited thereto. Owing to the underfill UF, a bonding strength of the package structure P6 is enhanced.

Additionally, the package structure P1' may be replaced by the package structure P1 depicted in FIG. 14, the package structure P2 depicted in FIG. 17, or the package structure P3 depicted in FIG. 19, the disclose is not limited thereto. In an alternative embodiment, in FIG. 23, more than one of the package structures P1' (and/or the package structures P1 to P3) may be picked-up and placed on the insulating layer IN, and the package structures P1' (and/or the package structures P1 to P3) removably bonded to the insulating layer IN may be arranged in an array. When the package structures P1' (and/or the package structures P1 to P3) placed on the insulating layer IN are arranged in an array, the conductive pillars CP may be divided into groups corresponding to the number of the package structures P1' (and/or the package structures P1 to P3).

In accordance with some embodiments, a package structure includes a semiconductor die, a redistribution circuit structure, and a connection pad. The redistribution circuit structure is located on and electrically connected to the semiconductor die. The connection pad is embedded in and electrically connected to the redistribution circuit structure, and the connection pad includes a barrier film and a conductive pattern underlying thereto, where a surface of the barrier film is substantially leveled with an outer surface of the redistribution circuit structure.

In accordance with some embodiments, a package structure includes a redistribution circuit structure, a semiconductor die, a connection pad, a passivation layer, a dielectric layer, and a conductive terminal. The semiconductor die is located on a first outer surface of the redistribution circuit structure and electrically connected to the redistribution circuit structure. The connection pad is embedded in and electrically connected to the redistribution circuit structure, and the connection pad includes a barrier film and a conductive pattern underlying thereto. A surface of the barrier film is substantially leveled with a second outer surface of the redistribution circuit structure, and the second outer surface is opposite to the first outer surface. The passivation layer and the dielectric layer are sequentially located on the second outer surface and each partially covering the connection pad. The conductive terminal is located on and electrically connected to the connection pad.

In accordance with some embodiments, a method of manufacturing package structure includes the following steps, providing a carrier; disposing a connection pad on the carrier, the connection pad comprising a barrier film and a conductive pattern stacked thereon; forming a redistribution circuit structure on the carrier and embedding the connection pad in the redistribution circuit structure, wherein a surface of the barrier film is coplanar to an outer surface of the redistribution circuit structure; mounting a semiconductor die on the redistribution circuit structure; encapsulating the semiconductor die in an insulating material; debonding the carrier to expose the connection pad; sequentially forming a passivation layer and a dielectric layer on the connection pad to cover a portion of the connection pad exposed by the redistribution circuit structure; and disposing a conductive terminal on the connection pad exposed by the passivation layer and the dielectric layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a semiconductor die;
   a redistribution circuit structure, located on and electrically connected to the semiconductor die; and
   a connection pad, embedded in and electrically connected to the redistribution circuit structure, the connection pad comprising a barrier film and a conductive pattern underlying thereto, wherein a surface of the barrier film is substantially leveled with an outer surface of the redistribution circuit structure, and a sidewall of the barrier film is covered by the redistribution circuit structure.

2. The package structure of claim 1, wherein the connection pad comprises a first region, a second region and a third region, the second region are between the first region and the third region, and the third region is surrounded by the second region and the first region, wherein the package structure further comprises:
a passivation layer, located on the redistribution circuit structure and at least partially covering the connection pad;
a dielectric layer, located on the passivation layer and partially covering the connection pad; and
a conductive terminal, located on and electrically connected to the connection pad.

3. The package structure of claim 2, wherein the barrier film physically contacts the conductive pattern within the first region, the second region and the third region of the connection pad,
wherein the passivation layer is in physical contact with a portion of the barrier film within the first region of the connection pad, the dielectric layer is in physical contact with a portion of the barrier film within the second region of the connection pad, and the conductive terminal is in physical contact with a portion of the barrier film within the third region of the connection pad.

4. The package structure of claim 2, wherein the barrier film physically contacts the conductive pattern within the first region and the second region of the connection pad,
wherein the passivation layer is in physical contact with a portion of the barrier film within the first region of the connection pad, the dielectric layer is in physical contact with a portion of the barrier film within the second region of the connection pad, and the conductive terminal is in physical contact with a portion of the conductive pattern within the third region of the connection pad.

5. The package structure of claim 4, wherein the barrier film is not overlapped with the conductive pattern in a stacking direction of the barrier film and the conductive pattern within the third region of the connection pad.

6. The package structure of claim 2, wherein the barrier film physically contacts the conductive pattern within the first region of the connection pad,
wherein the passivation layer is in physical contact with a portion of the barrier film within the first region of the connection pad, the dielectric layer is in physical contact with a portion of the conductive pattern within the second region of the connection pad, and the conductive terminal is in physical contact with a portion of the conductive pattern within the third region of the connection pad.

7. The package structure of claim 6, wherein the barrier film is not overlapped with the conductive pattern in a stacking direction of the barrier film and the conductive pattern within the second region and the third region of the connection pad.

8. The package structure of claim 2, wherein at least a portion of the barrier film is sandwiched between the passivation layer and the conductive pattern.

9. The package structure of claim 1, further comprising:
an insulating material, encapsulating the semiconductor die and located on the redistribution circuit structure.

10. The package structure of claim 1, further comprising:
an insulating material, encapsulating the semiconductor die and located on the redistribution circuit structure;
a circuit substrate, bonded on and electrically connected to the redistribution circuit structure, the redistribution circuit structure is sandwiched between the circuit substrate and the semiconductor die.

11. The package structure of claim 1, further comprising:
an insulating material, encapsulating the semiconductor die and located on the redistribution circuit structure;
a circuit substrate, bonded on and electrically connected to the redistribution circuit structure, the redistribution circuit structure is sandwiched between the circuit substrate and the semiconductor die; and
an interposer having a plurality of through vias penetrating therethrough, bonded on and electrically connected to the redistribution circuit structure and the circuit substrate.

12. A package structure, comprising:
a redistribution circuit structure;
a semiconductor die, located on a first outer surface of the redistribution circuit structure and electrically connected to the redistribution circuit structure;
a connection pad, embedded in and electrically connected to the redistribution circuit structure, the connection pad comprising a bather film and a conductive pattern underlying thereto, wherein a surface of the barrier film is substantially leveled with a second outer surface of the redistribution circuit structure, and the second outer surface is opposite to the first outer surface;
a passivation layer and a dielectric layer, sequentially located on the second outer surface and each partially covering the connection pad, wherein the redistribution circuit structure is located between the dielectric layer and the semiconductor die; and
a conductive terminal, located on and electrically connected to the connection pad.

13. The package structure of claim 12, wherein the connection pad comprises a first region, a second region and a third region, and the second region is located between and surrounded by the first region and the third region,
wherein the barrier film physically contacts the conductive pattern within the first region, the second region and the third region of the connection pad,
wherein the passivation layer is in physical contact with a portion of the barrier film within the first region, the dielectric layer is in physical contact with a portion of the barrier film within the second region, and the conductive terminal is in physical contact with a portion of the barrier film within the third region.

14. The package structure of claim 12, wherein the connection pad comprises a first region, a second region and a third region, and the second region is located between and surrounded by the first region and the third region,
wherein the barrier film physically contacts the conductive pattern within the first region and the second region of the connection pad,
wherein the passivation layer is in physical contact with a portion of the barrier film within the first region, the dielectric layer is in physical contact with a portion of the barrier film within the second region, and the conductive terminal is in physical contact with a portion of the conductive pattern within the third region.

15. The package structure of claim 12, wherein the connection pad comprises a first region, a second region and a third region, and the second region is located between and surrounded by the first region and the third region, wherein the barrier film physically contacts the conductive pattern within the first region of the connection pad, wherein the passivation layer is in physical contact with a portion of the barrier film within the first region, the dielectric layer is in physical contact with a portion of the conductive pattern within the second region, and the conductive terminal is in physical contact with a portion of the conductive pattern within the third region.

16. The package structure of claim 12, wherein the conductive terminal comprises a conductive portion and a barrier portion sandwiched between the conductive portion and the barrier film, and the barrier portion is in physical contact with the barrier film.

17. A method of manufacturing a package structure, comprising:
providing a carrier;
disposing a connection pad on the carrier, the connection pad comprising a barrier film and a conductive pattern stacked thereon;
forming a redistribution circuit structure on the carrier and embedding the connection pad in the redistribution circuit structure, wherein a surface of the barrier film is coplanar to an outer surface of the redistribution circuit structure;
mounting a semiconductor die on the redistribution circuit structure;
encapsulating the semiconductor die in an insulating material;
debonding the carrier to expose the connection pad;
sequentially forming a passivation layer and a dielectric layer on the connection pad to cover a portion of the connection pad exposed by the redistribution circuit structure, the redistribution circuit structure being located between the dielectric layer and the semiconductor die; and
disposing a conductive terminal on the connection pad exposed by the passivation layer and the dielectric layer.

18. The method of claim 17, wherein the connection pad comprising a first region, a second region and a third region, and the second region being sandwiched between the first region and the third region,
sequentially forming the passivation layer and the dielectric layer on the connection pad comprises:
forming the passivation layer on the connection pad and patterning the passivation layer to have a first opening over the second region and the third region, the passivation layer physical contacting the barrier film within the first region; and
forming the dielectric layer on the connection pad and patterning the dielectric layer to have a second opening over the third region, the dielectric layer physical contacting the barrier film within the second region,
wherein the conductive terminal is in physical contact with the barrier film within the third region.

19. The method of claim 17, wherein the connection pad comprising a first region, a second region and a third region, and the second region being sandwiched between the first region and the third region,
sequentially forming the passivation layer and the dielectric layer on the connection pad comprises:
forming the passivation layer on the connection pad and patterning the passivation layer to have a first opening over the second region and the third region, the passivation layer physical contacting the barrier film within the first region; and
forming the dielectric layer on the connection pad and patterning the dielectric layer to have a second opening over the third region, the dielectric layer physical contacting the barrier film within the second region, wherein patterning the dielectric layer to have the second opening further comprises removing a portion of the barrier film corresponding to the third region of the connection pad,
wherein the conductive terminal is in physical contact with the conductive pattern within the third region.

20. The method of claim 17, wherein the connection pad comprising a first region, a second region and a third region, and the second region being sandwiched between the first region and the third region,
sequentially forming the passivation layer and the dielectric layer on the connection pad comprises:
forming the passivation layer on the connection pad and patterning the passivation layer to have a first opening over the second region and the third region, the passivation layer physical contacting the barrier film within the first region, wherein patterning the passivation layer to have the first opening further comprises removing a portion of the barrier film corresponding to the second region and the third region of the connection pad; and
forming the dielectric layer on the connection pad and patterning the dielectric layer to have a second opening over the third region, the dielectric layer physical contacting the conductive pattern within the second region,
wherein the conductive terminal is in physical contact with the conductive pattern within the third region of the connection pad.

* * * * *